(12) United States Patent
Kim

(10) Patent No.: US 11,316,076 B2
(45) Date of Patent: Apr. 26, 2022

(54) LIGHT EMITTING DIODE PACKAGE AND LIGHT EMITTING MODULE INCLUDING THE SAME

(71) Applicant: SEOUL SEMICONDUCTOR CO., LTD., Gyeonggi-do (KR)

(72) Inventor: Ji Ho Kim, Gyeonggi-do (KR)

(73) Assignee: SEOUL SEMICONDUCTOR CO., LTD., Gyeonggi-Do (KR)

(*) Notice: Subject to any disclaimer, the term of this patent is extended or adjusted under 35 U.S.C. 154(b) by 46 days.

(21) Appl. No.: 16/818,699

(22) Filed: Mar. 13, 2020

(65) Prior Publication Data

US 2020/0220051 A1 Jul. 9, 2020

Related U.S. Application Data

(63) Continuation of application No. PCT/KR2018/013441, filed on Nov. 7, 2018.

(30) Foreign Application Priority Data

Dec. 19, 2017 (KR) .................. 10-2017-0175453
Nov. 2, 2018 (KR) .................. 10-2018-0133807

(51) Int. Cl.
*H01L 33/48* (2010.01)
*H01L 33/24* (2010.01)
(Continued)

(52) U.S. Cl.
CPC ............ *H01L 33/483* (2013.01); *H01L 33/24* (2013.01); *H01L 33/58* (2013.01); *H01L 33/62* (2013.01)

(58) Field of Classification Search
CPC ....... H01L 33/483; H01L 33/24; H01L 33/58; H01L 33/62
See application file for complete search history.

(56) References Cited

U.S. PATENT DOCUMENTS

| 9,048,394 B2 | 6/2015 | Lin et al. |
| 2007/0145403 A1 | 6/2007 | Tomioka et al. |
| 2019/0334063 A1* | 10/2019 | Kim .................. H01L 25/0753 |

FOREIGN PATENT DOCUMENTS

| CN | 201025615 Y | 2/2008 |
| CN | 105830240 A | 8/2016 |

(Continued)

OTHER PUBLICATIONS

International Search Report for International Application PCT/KR2018/013441, dated Feb. 27, 2019.

(Continued)

*Primary Examiner* — Jay C Chang
*Assistant Examiner* — Mikka Liu
(74) *Attorney, Agent, or Firm* — Burris Law, PLLC

(57) ABSTRACT

A light emitting diode package includes a body part having a cavity at the upper part thereof and having a long shape in one direction; and a first lead frame and a second lead frame which are coupled to the bottom of the body part and spaced apart from each other in a transverse direction. The first lead frame includes a first mounting part exposed in the cavity; a first terminal part exposed to one side surface of the body part; and a first connection part exposed to the lower surface of the body part. The second lead frame includes a second mounting part exposed in the cavity; a second terminal part exposed to the other side surface of the body part along a one-side direction; and a second connection part exposed to the lower surface of the body part.

24 Claims, 10 Drawing Sheets

(51) Int. Cl.
  *H01L 33/58*  (2010.01)
  *H01L 33/62*  (2010.01)

(56) References Cited

FOREIGN PATENT DOCUMENTS

| KR | 1020060069739 | 6/2006 |
| KR | 1020140132516 | 11/2014 |
| KR | 1020150042162 | 4/2015 |
| KR | 1020160059144 | 5/2016 |

OTHER PUBLICATIONS

Office Action issued in corresponding CN Application No. 201880005501.5, dated Dec. 3, 2021, 8 pages.

\* cited by examiner

LIGHT EMITTING DIODE PACKAGE AND LIGHT EMITTING MODULE INCLUDING THE SAME

CROSS-REFERENCE TO RELATED APPLICATION(S)

This application is a continuation of PCT Application No. PCT/KR2018/013441 filed Nov. 7, 2018, which claims priority to and benefits of Korean Patent Application No. 10-2017-0175453 filed Dec. 19, 2017, and Korean Patent Application No. 10-2018-0133807 filed on Nov. 2, 2018. The entire contents of the aforementioned patent applications are incorporated herein by reference in their entirety.

TECHNICAL FIELD

Embodiments of the present disclosure relate to a light emitting diode package and a light emitting module including the same.

BACKGROUND

In general, a light emitting diode package is used as a light source in various fields, such as a light source for backlight modules in a display device. In particular, the light emitting diode packages used as the light source for backlight modules can be classified into a top type light emitting diode package and a side-view type light emitting diode package. The side-view type light emitting diode package is used in an edge type backlight module to emit light to a side surface of a light guide plate.

SUMMARY

A light emitting diode package used in an edge type backlight module is generally required to emit light narrowly in a thickness direction of a light guide plate, that is, in a vertical direction thereof, while emitting light broadly in a lateral direction along an edge of the light guide plate. To this end, the side-view type light emitting diode package used in the edge type backlight module generally has an elongated shape in one direction.

On the other hand, a typical side-view type light emitting diode package has opposite polarity terminals at one side thereof. Accordingly, the opposite polarity terminals have a narrow area and are placed close to each other, thereby causing failure in contact between probes and the terminals upon testing.

In addition, the typical side-view type light emitting diode package has opposite polarity connecting portions disposed on a lower surface thereof and having a thin elongated shape. Accordingly, it is difficult for the light emitting diode package to secure a sufficient area for electrical connection to an external component, such as a circuit board of a backlight module.

Embodiments of the present disclosure provide a light emitting diode package that includes a single-polarity terminal formed on each of opposite side surfaces of a package substrate to secure a large area for each terminal, thereby preventing failure in contact between probes and the terminals.

Embodiments of the present disclosure provide a light emitting diode package that includes a single-polarity terminal formed on each of the opposite side surfaces of the package substrate to prevent short circuit between probes brought into contact with the terminals having opposite polarities.

Embodiments of the present disclosure provide a light emitting diode package that can prevent failure in contact between the terminals and the probes and short circuit between the probes, thereby enabling an accurate classification process.

Embodiments of the present disclosure provide a light emitting module that has reliability through accurate classification of light emitting diode packages.

In accordance with one embodiment of the present disclosure, a light emitting diode package includes a main body, a first lead frame, and a second lead frame. The main body includes a cavity formed at an upper portion thereof and has an elongated shape in one direction thereof. The first lead frame is coupled to a bottom of the main body and includes a first mount exposed to the cavity, a first terminal exposed to one side surface of the main body and a first connecting portion exposed to a lower surface of the main body. The second lead frame is spaced apart from the first lead frame in a lateral direction and is coupled to the bottom of the main body. Further, the second lead frame includes a second mount exposed to the cavity, a second terminal exposed to the other side surface of the main body and a second connecting portion exposed to the lower surface of the main body. Here, the first connecting portion includes a first element extending from the first terminal and a second element extending from a portion of the first element towards the second terminal in the one direction. In addition, the second connecting portion includes a third element extending from the second terminal and a fourth element extending from a portion of the third element towards the first terminal in the one direction.

In accordance with another embodiment of the present disclosure, a light emitting module includes a circuit board and the light emitting diode package mounted on the circuit board. Here, the light emitting diode package emits light towards one side surface of a light guide plate.

Embodiments of the present disclosure provide a light emitting diode package that includes a single-polarity terminal formed on each of opposite side surfaces of a package substrate to secure a large area for each terminal, thereby preventing failure in contact between probes and the terminals, and a light emitting module including the same. With this structure, the light emitting diode package can prevent short circuit between the probes brought into contact with the terminals having opposite polarities. In addition, a package substrate can prevent failure in contact between the terminals and the probes and short circuit between the probes, thereby improving reliability in classification of light emitting diode packages.

BRIEF DESCRIPTION OF DRAWINGS

The accompanying drawings, which are included to provide a further understanding of the disclosed technology, and are incorporated in and constitute a part of this specification, illustrate exemplary embodiments of the disclosed technology, and together with the description serve to describe the principles of the disclosed technology.

FIG. 1 is a sectional view of the package substrate according to the first embodiment, FIG. 2 is a bottom view of the package substrate according to the first embodiment, and FIG. 3 is a top view of the package substrate according to the first embodiment.

FIG. 4 is a sectional view of the package substrate according to the second embodiment and FIG. 5 is a bottom view of the package substrate according to the second embodiment.

FIG. 6 is a sectional view of the light emitting diode package according to this embodiment. FIG. 7 is a bottom view of a light emitting diode chip mounted on the light emitting diode package and FIG. 8 is a sectional view of the light emitting diode chip.

FIG. 9 is a sectional view of the light emitting diode package according to this embodiment. FIG. 10 is a top view of the light emitting diode package according to this embodiment.

FIG. 12 to FIG. 14 are views of lead frames of the package substrate according to the third embodiment.

FIG. 15 is a plan view of the package substrate according to the third embodiment.

FIG. 16 is a bottom view of the package substrate according to the third embodiment.

FIG. 17 is a side view of the package substrate according to the second embodiment.

FIG. 18 to FIG. 21 are sectional views of the package substrate according to the third embodiment.

FIG. 22 is a top view of the light emitting diode package according to a further embodiment. FIG. 23 is a cross-sectional view (F1-F2) of the light emitting diode package shown in FIG. 22. FIG. 24 is a cross-sectional view (F3-F4) of the light emitting diode package shown in FIG. 22.

DETAILED DESCRIPTION OF THE EMBODIMENTS

Figure 1:
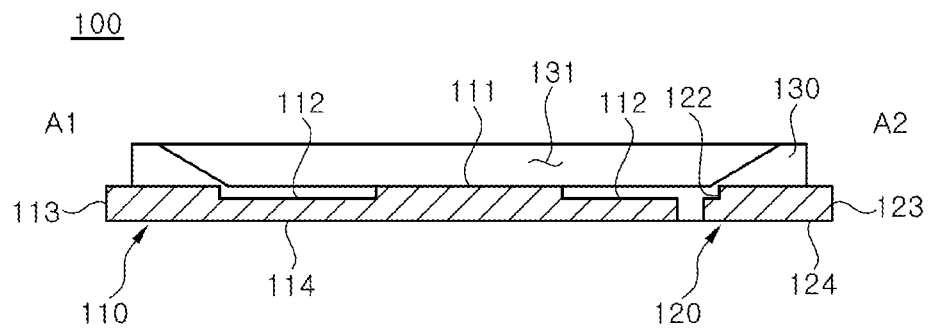
FIG. 1 to FIG. 3 are views of a package substrate according to a first embodiment of the present disclosure.

Hereinafter, embodiments of the present disclosure will be described in detail with reference to the accompanying drawings. The following embodiments are provided by way of example so as to fully convey the spirit of the present disclosure to those skilled in the art. Accordingly, the present disclosure is not limited to the embodiments disclosed herein and can also be implemented in different forms. In the drawings, widths, lengths, thicknesses, and the like of elements or components can be exaggerated for clarity and descriptive purposes. Throughout the specification, like reference numerals denote like elements having the same or similar functions.

According to one embodiment of the present disclosure, a light emitting diode package includes a main body, a first lead frame, and a second lead frame. The main body includes a cavity at an upper portion thereof and has an elongated shape in one direction thereof. The first lead frame is coupled to a bottom of the main body and includes a first mount exposed to the cavity, a first terminal exposed to one short side surface of the main body, and a first connecting portion exposed to a lower surface of the main body. The second lead frame is spaced apart from the first lead frame in a lateral direction and is coupled to the bottom of the main body. Further, the second lead frame includes a second mount exposed to the cavity, a second terminal exposed to the other short side surface of the main body, and a second connecting portion exposed to the lower surface of the main body. Here, the first connecting portion includes a first element extending from the first terminal and a second element extending from a portion of the first element towards the second terminal in the one direction. In addition, the second connecting portion includes a third element extending from the second terminal and a fourth element extending from a portion of the third element towards the first terminal in the one direction.

The second element and the fourth element are disposed parallel to each other. Further, at least one of the first connecting portion and the second connecting portion intersects with a central line perpendicular to the one direction.

In the light emitting diode package, a portion of the first element has a greater width than another portion thereof and a portion of the first element includes a portion extending from the first terminal. Further, another portion of the first element includes a portion extending from the second element.

In the light emitting diode package, a portion of the third element may have a greater width than another portion thereof and a portion of the third element may include a portion extending from the second terminal. Further, another portion of the third element may include a portion extending from the fourth element.

The cavity of the main body may have a width gradually increasing from a lower portion thereof to an upper portion thereof. The first lead frame may further include a first through-hole formed through the first lead frame. In addition, a portion of the main body may be placed in the first through-hole. An upper portion of the first through-hole may have a smaller width than a lower portion thereof. The second lead frame may further include a second through-hole formed through the second lead frame. In addition, a portion of the main body may be placed in the second through-hole.

An upper portion of the second through-hole may have a smaller width than a lower portion thereof. The first lead frame may further include a first groove formed on an upper surface thereof. The first groove may be filled with the main body. The second lead frame may further include a second groove formed on an upper surface thereof. The second groove may be filled with the main body.

A separation distance between the second element and the third element and a separation distance between the fourth element and the first element may be greater than a separation distance between the second element and the fourth element. In addition, the separation distance between the second element and the third element and the separation distance between the fourth element and the first element may be smaller than a separation distance between the second element and a side surface of the main body and a separation distance between the fourth element and the side surface of the main body.

The first mount and the second mount may have an elongated shape in one direction. The light emitting diode package may further include a light emitting diode chip disposed in the cavity of the main body and electrically connected to the first mount and the second mount, and a sealing member filling the cavity to enclose the light emitting diode chip.

The light emitting diode chip may include a substrate having an elongated shape in one direction thereof, a light emitting structure, a first bump pad, and a second bump pad. The light emitting structure includes a first conductivity type semiconductor layer, an active layer, and a second conductivity type semiconductor layer sequentially stacked on a lower surface of the substrate. In addition, the first bump pad is electrically connected to the first conductivity type semiconductor layer. Further, the second bump pad is spaced apart from the first bump pad in a lateral direction and electrically connected to the second conductivity type semiconductor layer. Further, the first bump pad and the second bump pad extend in the one direction of the substrate. The first bump pad is disposed on the first mount and the second bump pad is disposed on the second mount.

According to another embodiment of the present disclosure, there is provided a light emitting module including a circuit board and the light emitting diode package mounted on the circuit board. Here, the light emitting diode package emits light towards one side of a light guide plate.

The circuit board may include a first region in which the light emitting diode package is disposed and a circuit pattern is formed, and a second region perpendicular to the first region.

In the light emitting module, the first connecting portion and the second connecting portion disposed on the lower surface of the light emitting diode package may be connected to the circuit pattern in the first region of the circuit board. Further, in the light emitting module, an upper surface of the light emitting diode package through which light is emitted may be disposed to face one side surface of the light guide plate. The light emitting diode package may be provided in plural.

Hereinafter, embodiments of the present disclosure will be described in detail.

Figure 2:
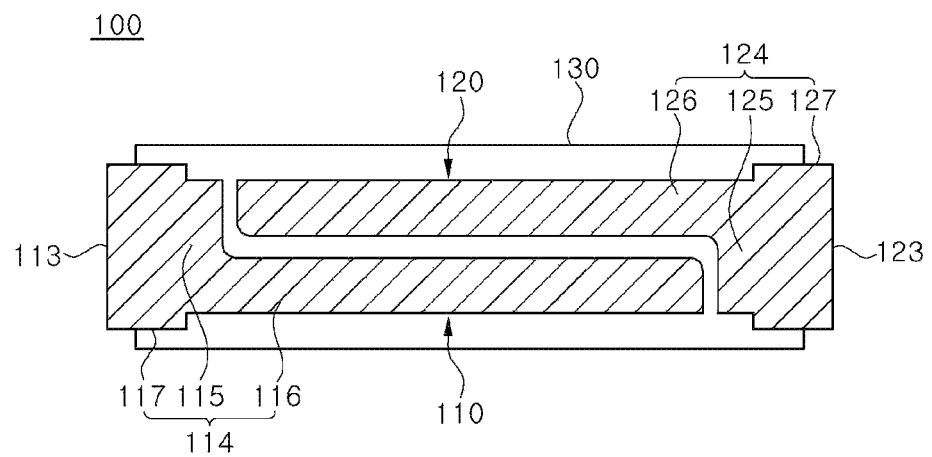
Figure 3:
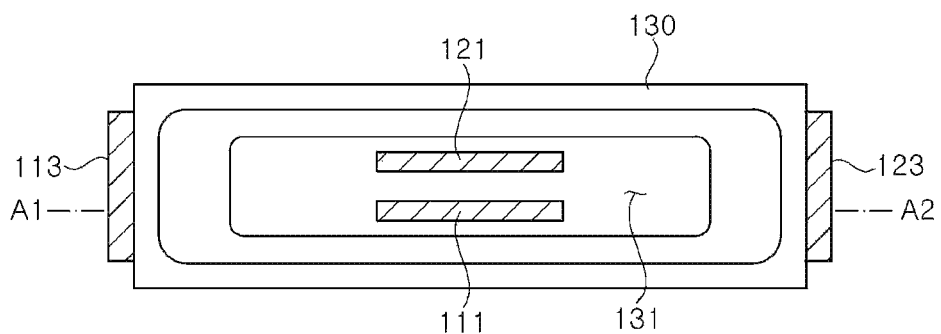

FIG. 1 to FIG. 3 are views of a package substrate according to a first embodiment of the present disclosure. FIG. 1 is a sectional view of the package substrate according to the first embodiment, FIG. 2 is a bottom view of the package substrate according to the first embodiment, and FIG. 3 is a top view of the package substrate according to the first embodiment.

Referring to FIG. 1 to FIG. 3, the package substrate 100 according to the first embodiment includes a first lead frame 110, a second lead frame 120, and a main body 130.

The main body 130 supports the first lead frame 110 and the second lead frame 120 such that the first lead frame 110 and the second lead frame 120 are spaced apart from each other while surrounding the first lead frame 110 and the second lead frame 120. For example, the main body 130 is formed of a thermosetting resin.

The main body 130 has an elongated shape in one direction thereof. Accordingly, the main body 130 includes side surfaces having long sides in one direction and side surfaces having short sides in the other direction. For example, a lower surface of the main body 130 may have a rectangular shape including two long sides facing each other and two relatively short sides facing each other. The main body 130 has a cavity 131 formed at an upper portion thereof to receive a light emitting diode chip (not shown) therein. Referring to FIG. 1, the cavity 131 has a taper structure having a width gradually increasing from a lower portion thereof to an upper portion thereof. However, it should be understood that the cavity 131 is not limited thereto and may have a structure wherein the upper portion of the cavity has the same width as the lower portion thereof.

The first lead frame 110 and the second lead frame 120 are coupled to the bottom of the main body 130. In addition, the first lead frame 110 and the second lead frame 120 are disposed to be spaced apart from each other inside the main body 130 in a lateral direction and are insulated from each other by the main body 130.

The first lead frame 110 includes a first mount 111, a first groove 112, a first terminal 113, and a first connecting portion 114.

The first mount 111 and the first groove 112 are formed on an upper surface of the first lead frame 110. The first groove 112 is formed by half-etching the upper surface of the first lead frame 110 to form a concave structure on the upper surface thereof. The first groove 112 is filled with the main body 130. A bonding area between the main body 130 and the first lead frame 110 is increased by the first groove 112, thereby improving coupling strength between the first lead frame 110 and the main body 130. In addition, the first groove 112 forms a long penetration path from a side surface of the main body 130 to the interior of the cavity 131, thereby preventing foreign matter including moisture from entering the cavity 131.

The first mount 111 is exposed inside the cavity 131. The first mount 111 refers to a portion of the first lead frame 110 that allows a light emitting diode chip (not shown) to be mounted thereon and is electrically connected thereto. The first groove 112 is formed along the circumference of the first mount 111. Accordingly, the first mount 111 protrudes above the first groove 112 filled with the main body 130 and thus is exposed to a bottom surface of the cavity 131. Referring to FIG. 3, the first mount 111 may extend along one side surface of the main body 130, which includes a long side thereof.

A side surface of the first lead frame 110 protrudes from one side surface of the main body 130. The first terminal 113 includes the side surface of the first lead frame 110 exposed from the one side surface of the main body 130. That is, the first terminal 113 corresponds to a side surface of a portion of the first lead frame 110 protruding from the one side surface of the main body 130. Here, the one side surface of the main body 130 corresponds to one side surface of the main body 130, which includes a short side thereof.

The first connecting portion 114 is exposed to the lower surface of the main body 130. The first connecting portion 114 refers to a portion of the first lead frame 110 electrically connected to external components, such as a circuit board and the like. The first connecting portion 114 includes a first element 115 and a second element 116. The first connecting portion 114 further includes a first expanded portion 117 which will be explained in detail later.

The first element 115 is connected to the first terminal 113. According to this embodiment, since the first element 115 extends from the first terminal 113, the first element 115 may have the same width as or a similar width to the first terminal 113. Referring to FIG. 1 to FIG. 3, since the first terminal 113 corresponds to a side surface of a portion of the first lead frame 110 protruding from the one side surface of the main body 130, the first element 115 includes a lower surface of the portion of the first lead frame 110 protruding from the one side surface of the main body 130. That is, the first element 115 has a large area extending to an external region of the main body 130 instead of being restrictively placed in regions of the main body 130.

The second element 116 extends from a portion of the first element 115 and has an elongated structure. Here, the second element 116 extends from the first element 115 towards the second terminal 123 disposed at an opposite side to the first terminal 113. Referring to FIG. 3, the second element 116 has a narrower width than the first element 115.

Although the first connecting portion 114 is illustrated as being divided into the first element 115 and the second element 116 in description of the first embodiment, it should be noted that this description is provided for convenience and the first element 115 and the second element 116 are integrally connected to each other.

The second lead frame 120 includes a second mount 121, a second groove 122, a second terminal 123, and a second connecting portion 124, as shown in FIGS. 1-3.

The second mount 121 and the second groove 122 are formed on an upper surface of the second lead frame 120. The second groove 122 is formed by half-etching the upper surface of the second lead frame 120 to form a concave structure on the upper surface thereof. The second groove 122 is filled with the main body 130. A bonding area between the main body 130 and the second lead frame 120 may be increased by the second groove 122, thereby improving coupling strength between the second lead frame 120 and the main body 130. In addition, like the first groove 112, the second groove 122 may form a long penetration path along which foreign matter including moisture enters the cavity 131.

Referring to FIG. 1, the first groove 112 and the second groove 122 are disposed outside the cavity 131 of the main body 130. However, it should be understood that the first groove 112 and the second groove 122 are not necessarily disposed outside the cavity 131. The locations of the first groove 112 and the second groove 122 may be changed, as needed.

The second mount 121 is exposed inside the cavity 131. The second mount 121 refers to a portion of the second lead frame 120 that allows a light emitting diode chip (not shown) to be mounted thereon and is electrically connected thereto. The second groove 122 is formed along the circumference of the second mount 121. Accordingly, the second mount 121 protrudes above the second groove 122 filled with the main body 130 and thus is exposed from the bottom surface of the cavity 131. Referring to FIG. 3, the second mount 121 may extend along one side surface of the main body 130, which includes a long side thereof. With this structure, the second mount 121 is disposed to be spaced apart from the first mount 111 in the lateral direction.

Although the first mount 111 and the second mount 121 are illustrated as being spaced apart from each other in this embodiment as shown in FIG. 3, it should be understood that other implementations are possible. The structures of the first mount 111 and the second mount 121 may be changed depending upon the structure of a light emitting diode chip to be received in the cavity 131.

A side surface of the second lead frame 120 protrudes from the other side surface of the main body 130, which includes a short side thereof. The second terminal 123 includes the side surface of the second lead frame 120 protruding from the other side surface of the main body 130. That is, the second terminal 123 corresponds to a side surface of a portion of the second lead frame 120 protruding from the other side surface of the main body 130.

As shown in the drawings, the first terminal 113 protrudes from the one side surface of the main body 130 and is formed along the one side surface of the main body 130. In addition, the second terminal 123 protrudes from the other side surface of the main body 130 and is formed along the other side surface of the main body 130, as shown in FIGS. 1-3. As such, the first terminal 113 and the second terminal 123 protruding from the opposite sides of the main body 130 in the lateral direction can reflect light.

Some fraction of light emitted from a backlight unit to a light guide plate (not shown) may be reflected by the light guide plate towards a circuit board (not shown). Here, when the package substrate 100 according to this embodiment is applied to the backlight unit, the light traveling towards the circuit board is reflected by the first terminal 113 and the second terminal 123 protruding from the main body to enter the light guide plate (not shown). That is, the package substrate 100 according to this embodiment prevents reflected light from being absorbed into a space between packages and reflects the light to enter the light guide plate. Accordingly, the package substrate 100 may be applied to the backlight unit and prevent generation of dark spots on the light guide plate between the packages. Conventionally, since opposite-polarity terminals are disposed on one side surface of a package substrate, each of the terminals is inevitably formed to a narrow width. That is, a typical package substrate allows an insufficient area for each terminal. As a result, failure in contact between a probe and the terminals can occur in a process of classifying defective or high quality products of package substrates or light emitting diode packages, thereby causing errors in classification.

In the package substrate 100 according to this embodiment, the first terminal 113 and the second terminal 123 may be used as parts to which electric current is applied through probes upon testing of the package substrate 100 or the light emitting diode package. According to this embodiment, since only the first terminal 113 is disposed on one side surface of the main body 130, the first terminal 113 can be formed in a large area. Likewise, since only the second terminal 123 is disposed on the other side surface of the main body 130, the second terminal 123 can be formed in a large area. Since the package substrate 100 has only one terminal on one side surface of the main body 130, the terminals of the package substrate 100 have a larger area than the terminals of the typical package substrate.

As such, the package substrate 100 according to this embodiment has a sufficient contact area between the terminals and the probes, thereby preventing failure in contact between the probes and the terminals. As a result, the package substrate according to this embodiment prevents failure in testing, for example, classification, of package substrates or light emitting diode packages including the same, thereby improving test reliability.

The second connecting portion 124 is exposed to the lower surface of the main body 130. The second connecting portion 124 includes a third element 125 and a fourth element 126, as shown in FIG. 2. The second connecting portion 124 further includes a second expanded portion 127 which will be explained in detail later.

The third element 125 is connected to the second terminal 123. According to this embodiment, since the third element 125 extends from the second terminal 123, the third element 125 may have the same width as the second terminal 123 or a similar width thereto. In addition, like the first element 115, the third element 125 also has a large area extending to an external region of the main body 130 instead of being restrictively placed in regions of the main body 130.

The fourth element 126 extends from a portion of the third element 125 and has an elongated structure. Here, the fourth element 126 extends from the third element 125 towards the first terminal 113. Referring to FIG. 3, the fourth element 126 has a narrower width than the third element 125.

Referring to FIG. 2, the second element 116 is disposed parallel to the fourth element 126. In addition, at least one of the second element 116 and the fourth element 126 intersects with the central line perpendicular to one direction of the package substrate.

The typical package substrate includes connecting portions restrictively placed in an interior region of the main body and has an elongated narrow structure. On the contrary, the package substrate 100 according to this embodiment has a large width and includes the first element 115 and the third element 125, which extend to an exterior region of the main body 130, and the second element 116 and the fourth element 126, which have an elongated structure. As such, the connecting portions of the package substrate 100 according to this embodiment have a larger area than those of the typical package substrate, thereby allowing reliable and stable electrical connection to external components.

In addition, the package substrate 100 according to this embodiment has only one terminal on one side surface of the main body 130, thereby allowing easy electrical connection to external components through the side surface. Further, the package substrate 100 according to this embodiment may employ all of the first connecting portion 114 and the second connecting portion 124 disposed on the lower surface thereof and the first terminal 113 and the second terminal 123 disposed on the side surfaces thereof for electrical connection to external components. That is, the package substrate 100 can achieve electrical connection to external components through a larger area including the lower surface and the side surfaces thereof.

In the typical package substrate, the opposite polarity terminals are disposed on one side of the package substrate. Accordingly, the opposite polarity terminals are placed close to each other, thereby causing short circuit upon contact between probes and the opposite polarity terminals. On the contrary, the package substrate 100 according to this embodiment includes only one terminal on one side surface of the main body 130, thereby preventing short circuit when the probes are brought into contact with the opposite polarity terminals.

Further, in the package substrate 100 according to this embodiment, at least one of the first connecting portion 114 and the second connecting portion 124 intersects with the central line perpendicular to one direction of the package substrate, thereby improving strength of the center of the package substrate 100.

According to this embodiment, a portion of each of the first element 115 and the third element 125 has a greater width than another portion thereof. The portion of the first element 115 having a greater width includes a portion extending from the first terminal 113 and the portion of the third element 125 having a greater width includes a portion extending from the second terminal 123. Further, a portion of the first element 115 having a small width includes a portion extending from the second element 116 and a portion of the third element 125 having a small width includes a portion extending from the fourth element 126.

For convenience of description, portions of the first element 115 and the third element 125 expanded to have greater widths will be referred to as a first expanded portion 117 and a second expanded portion 127, respectively. Referring to FIG. 2, other portions of the first connecting portion 114 and the second connecting portion 124 excluding the first expanded portion 117 and the second expanded portion 127 are placed in regions inside the first expanded portion 117 and the second expanded portion 127.

A side surface of each of the first expanded portion 117 and the second expanded portion 127 corresponds to a portion of the first or second lead frame to be cut in a separation process by which plural lead frames connected to each other are individually divided. Without the first expanded portion 117 and the second expanded portion 127, burrs can be generated from the first lead frame 110 and the second lead frame 120 when a cutting blade brushes against one side surface of each of the first lead frame 110 and the second lead frame 120 in the process of separating the lead frames. That is, the first expanded portion 117 and the second expanded portion 127 can prevent generation of burrs from the lead frames by preventing other portions of the first-1 and third elements excluding the first expanded portion 117 and the second expanded portion 127 from contacting the cutting blade in the process of separating the lead frames.

Further, the first expanded portion 117 and the second expanded portion 127 are connected to the first terminal 113 and the second terminal 123 to protrude from both side surfaces of the main body 130, respectively. Accordingly, the first expanded portion 117 and the second expanded portion 127 also serve to reflect light together with the first terminal 113 and the second terminal 123. As such, each of the first expanded portion 117 and the second expanded portion 127 may be formed to a width preventing generation of burrs in the process of separating the lead frames while reflecting as much light as possible.

Further, according to this embodiment, a separation distance between the second element 116 and the third element 125 and a separation distance between the fourth element 126 and the first element 115 are greater than a separation distance between the second element 116 and the fourth element 126.

Since each of the first element 115 and the third element 125 has a large area, a large amount of a bonding agent is used upon bonding of the package substrate 100 to an external component. Here, when the amount of the bonding agent increases, the bonding agent can flow to an outer region of the first element 115 and the third element 125 upon compression of the package substrate 100 on the external component. Then, electrical conduction can occur between the first element 115 and the fourth element 126 or between the third element 125 and the second element 116. Thus, in order to prevent this problem, the separation distance between the second element 116 and the third element 125 and the separation distance between the fourth element 126 and the first element 115 are set with reference to a separation distance between the second element 116 and the fourth element 126 not allowing electrical conduction by the bonding agent.

However, when the separation distance between the second element 116 and the third element 125 and the separation distance between the fourth element 126 and the first element 115 are too large, the size of the package substrate 100 may increase. Thus, in order to prevent undesirable increase in size or length of the package substrate 100, the separation distance between the second element 116 and the third element 125 and the separation distance between the fourth element 126 and the first element 115 are configured to be smaller than a separation distance between the second element 116 and the side surface of the main body 130 and a separation distance between the fourth element 126 and the side surface of the main body 130, respectively.

Figure 4:
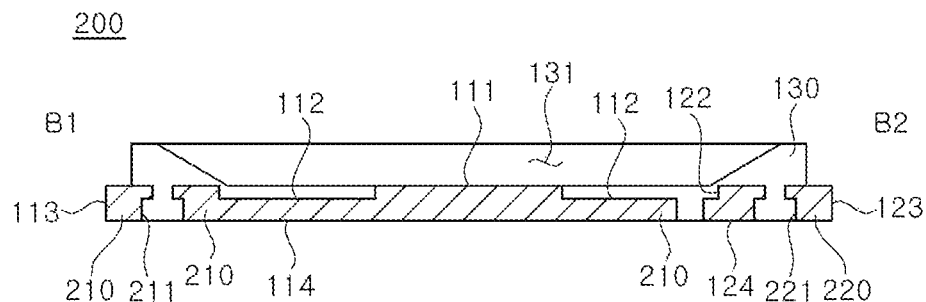
FIG. 4 and FIG. 5 are views of a package substrate according to a second embodiment of the present disclosure.
Figure 5:
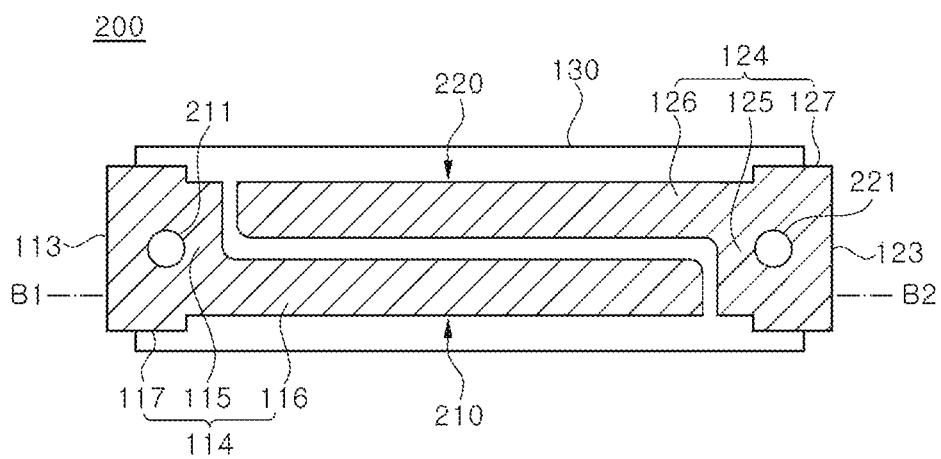

FIG. 4 and FIG. 5 are views of a package substrate according to a second embodiment of the present invention. FIG. 4 is a sectional view of the package substrate according to the second embodiment and FIG. 5 is a bottom view of the package substrate according to the second embodiment.

In description of the package substrate 200 according to the second embodiment, descriptions of the same components as those of the package substrate 100 according to the first embodiment (FIG. 1 to FIG. 3) will be omitted and the following description will focus on different features of the package substrate 200 according to the second embodiment.

Referring to FIG. 4 and FIG. 5, in the package substrate 200 according to the second embodiment, a first lead frame 210 is formed with a first through-hole 211 and a second lead frame 220 is formed with a second through-hole 221.

The first through-hole 211 is disposed between the first groove 112 and the first terminal 113 of the first lead frame 210 and is formed to penetrate the first lead frame 210 from an upper surface of the first lead frame 210 to a lower surface thereof. In addition, the second through-hole 221 is disposed between the second groove 122 and the second terminal 123 of the second lead frame 220 and is formed to penetrate the second lead frame 220 from an upper surface of the second lead frame 220 to a lower surface thereof.

The first through-hole 211 formed through the first lead frame 210 and the second through-hole 221 formed through the second lead frame 220 are filled with the main body 130. A bonding area between each of the first lead frame 210 and the second lead frame 220 and the main body 130 is increased by the first through-hole 211 or the second through-hole 221, thereby improving coupling strength therebetween.

Each of the first through-hole 211 and the second through-hole 221 may have a structure wherein an upper portion has the same width as a lower portion, or alternatively, may have a stepped structure wherein the upper portion has a different width from the lower portion.

For example, the first through-hole 211 and the second through-hole 221 may have a structure wherein the upper portion has a smaller width than the lower portion, as shown in FIG. 4. In this structure, a portion of the main body 130 filling the lower portion of the first through-hole 211 is caught by the upper portion of the first through-hole 211 having a small width, whereby the main body 130 can be secured to the first lead frame 210. Further, when the second through-hole 221 has a structure wherein the upper portion has a smaller width than the lower portion, the main body 130 can be secured to the second lead frame 220. Accordingly, with such structures of the first through-hole 211 and the second through-hole 221, the package substrate 200 enables firmer coupling between the main body 130 and each of the first lead frame 210 and the second lead frame 220.

Figure 6:
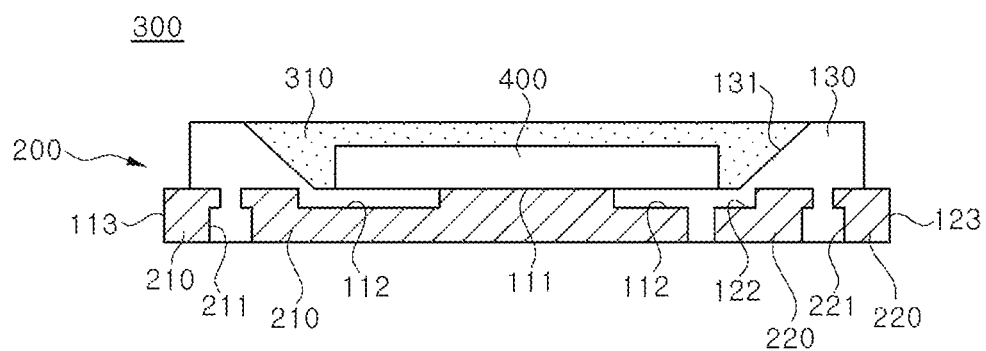
FIG. 6 to FIG. 8 are views of a light emitting diode package according to one embodiment of the present disclosure.
Figure 7:
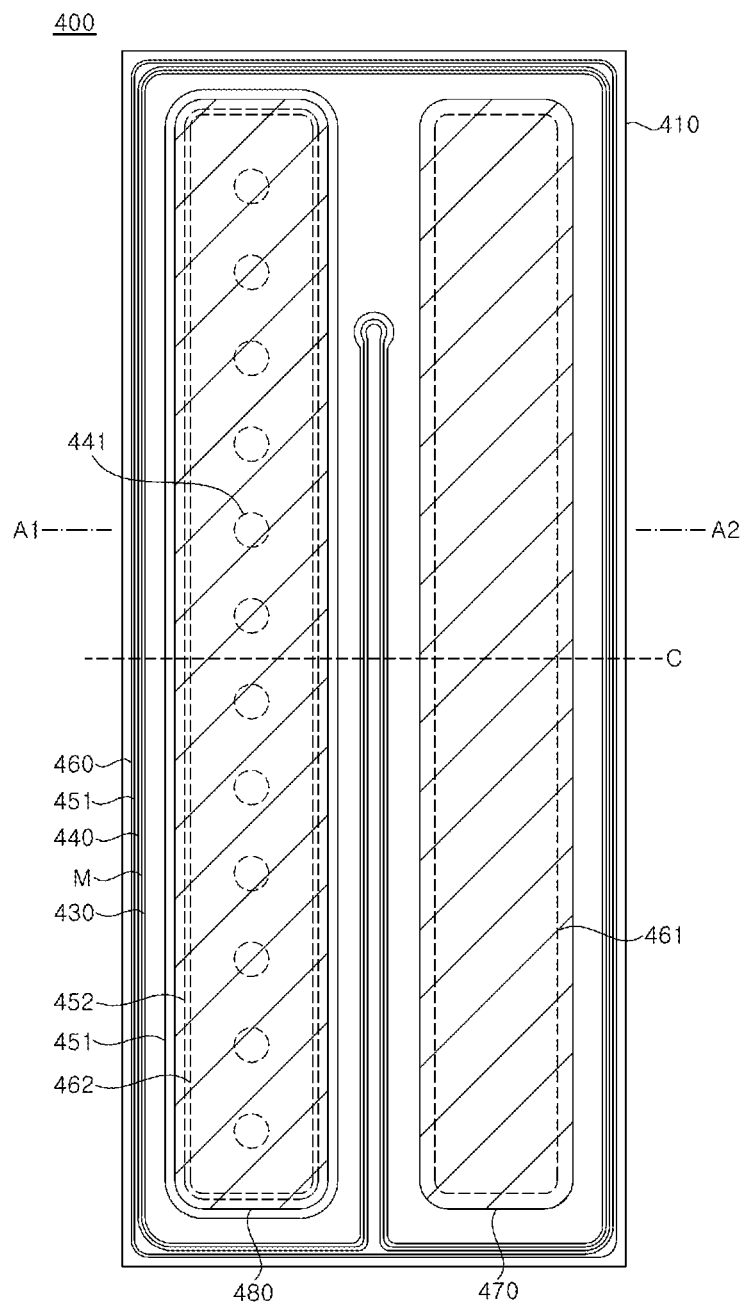
Figure 8:
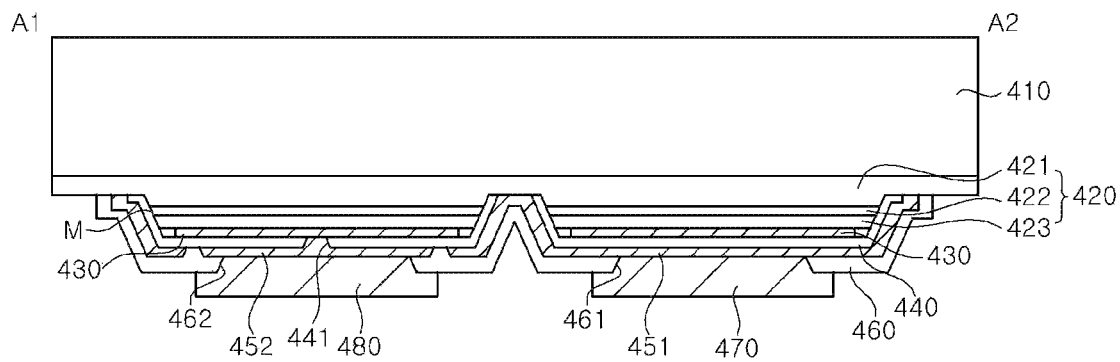

FIG. 6 to FIG. 8 are views of a light emitting diode package according to one embodiment of the present disclosure.

FIG. 6 is a sectional view of the light emitting diode package 300 according to this embodiment as shown in FIGS. 4-5. In addition, FIG. 7 is a bottom view of a light emitting diode chip mounted on the light emitting diode package and FIG. 8 is a sectional view of the light emitting diode chip as shown in FIG. 7.

The light emitting diode package 300 according to this embodiment (shown in FIG. 6) includes a package substrate 200, a light emitting diode chip 400, and a sealing member 310.

The package substrate 200 shown in FIG. 6 is the package substrate according to the second embodiment. However, it should be understood that the package substrate 200 is not limited to the package substrate according to the second embodiment and may include the package substrate according to the first embodiment. The light emitting diode chip 400 is disposed in the cavity 131 of the package substrate 200. The light emitting diode chip 400 may have a structure wherein bump pads (not shown) having opposite polarities are formed on a lower surface thereof. The bump pads of the light emitting diode chip 400 may correspond to the first mount 111 and the second mount 121 of the package substrate 200.

Referring to FIG. 7 and FIG. 8, the light emitting diode chip 400 according to this embodiment includes a substrate 410, a light emitting structure 420, an ohmic reflective layer 430, a first insulation layer 440, a first pad metal layer 451, a second pad metal layer 452, a second insulation layer 460, a first bump pad 470, and a second bump pad 480. With these components, the light emitting diode chip 400 has a structure wherein a lower periphery of the light emitting diode chip 400 has an elongated shape including long sides and short sides. Here, the long sides refer to sides of the lower periphery having a long length and the short sides refer to sides of the lower periphery having a shorter length than the long sides.

The substrate 410 may be selected from any structures allowing growth of a gallium nitride semiconductor layer thereon without limitation. For example, the substrate 410 may include a sapphire substrate, a gallium nitride substrate, a SiC substrate, and the like, and may be a patterned sapphire substrate. The substrate 410 has a rectangular shape having long sides and short sides.

The light emitting structure 420 is formed on a lower surface of the substrate 410. The light emitting structure 420 includes a first conductivity type semiconductor layer 421, an active layer 422, and a second conductivity type semiconductor layer 423.

The first conductivity type semiconductor layer 421 is formed on the lower surface of the substrate 410. The first conductivity type semiconductor layer 421 may be a semiconductor layer grown on the substrate 410 and may be a gallium nitride semiconductor layer. The first conductivity type semiconductor layer 421 may be a gallium nitride semiconductor layer doped with n-type dopants, for example, Si. Here, although the first conductivity type semiconductor layer 421 is illustrated as being distinguished from the substrate 410, a border between the first conductivity type semiconductor layer 421 and the substrate 410 can be unclear when the substrate is a gallium nitride substrate.

A mesa M is disposed on a lower surface of the first conductivity type semiconductor layer 421. The mesa M may be placed in a region of the first conductivity type semiconductor layer 421. Accordingly, edge regions of the first conductivity type semiconductor layer 421 may be exposed to the outside instead of being covered by the mesa M. In addition, the mesa M may include a portion of the first conductivity type semiconductor layer 421.

The mesa M includes the second conductivity type semiconductor layer 423 and the active layer 422. The active layer 422 is formed on the lower surface of the first conductivity type semiconductor layer 421 and the second conductivity type semiconductor layer 423 is formed on the lower surface of the active layer 422. The active layer 422 may have a single quantum well structure or a multi-quantum well structure. The composition and thickness of well layers in the active layer 422 determine the wavelengths of light. In particular, the active layer may be formed to generate UV light, blue light or green light through adjustment of the composition of the well layers.

The second conductivity type semiconductor layer 423 may be a gallium nitride semiconductor layer doped with p-type dopants, for example, Mg.

Each of the first conductivity type semiconductor layer 421 and the second conductivity type semiconductor layer 423 may be composed of a single layer, without being limited thereto. Each of the first conductivity type semiconductor layer 421 and the second conductivity type semiconductor layer 423 may be composed of multiple layers and may include a super-lattice layer.

The first conductivity type semiconductor layer 421, the active layer 422 and the second conductivity type semiconductor layer 423 may be grown on the substrate 410 in a chamber by a method well-known in the art, such as metal organic chemical vapor deposition (MOCVD) or molecular-beam epitaxy (MBE).

The mesa M has a slanted side surface to have an area gradually decreasing with increasing distance from the first conductivity type semiconductor layer 421. With this structure, layers covering the side surface of the mesa M can be stably formed.

The mesa M may have an elongated rectangular shape along the shape of the substrate 410 and may include a groove formed in a longitudinal direction of the substrate 410 to expose the first conductivity type semiconductor layer 421. As shown in FIG. 7, the groove may extend from a center of one short side of the mesa M adjacent to one short side of the substrate to pass the center of the mesa M along a long side of the substrate 410. The groove has a shorter length than the length of a long side of the mesa M. Thus, the other side of the mesa M having a short length is separated from the groove.

The ohmic reflective layer 430 is formed on a lower surface of the second conductivity type semiconductor layer 423 to contact the second conductivity type semiconductor layer 423. The ohmic reflective layer 430 may be disposed over substantially the entire region of the mesa in an upper region of the mesa M. Referring to FIG. 8, the ohmic reflective layer 430 is not disposed to cover the entirety of the upper region of the mesa M. For example, the ohmic reflective layer 430 may cover 80% or more of the upper region of the mesa M. Furthermore, the ohmic reflective layer 430 may cover 90% or more of the upper region of the mesa M. Although not shown in this drawing, the light emitting structure may further include an ohmic oxide layer (not shown) disposed in the upper region of the mesa M and covering the mesa M around the ohmic reflective layer 430. With the structure where the ohmic oxide layer (not shown) is disposed around the ohmic reflective layer 430, the light emitting structure has an enlarged ohmic contact region, thereby resulting in reduction in forward voltage of a light emitting diode.

The ohmic reflective layer 430 may include a reflective metal layer. Accordingly, the ohmic reflective layer 430 reflects light generated from the active layer 422 and reaching the ohmic reflective layer 430 towards the substrate 410. For example, the ohmic reflective layer 430 may be composed of a single metal layer or may include an ohmic layer and a reflective layer. For example, the ohmic layer may be composed of a metal, such as Ni, and the reflective layer may be composed of a highly reflective metal, such as Ag or Al. In addition, the ohmic reflective layer 430 may include a barrier layer. The barrier layer may be composed of Ni, Ti, and Au. For example, the ohmic reflective layer may have a stack structure of Ni/Ag/Ni/Ti/Ni/Ti/Au/Ti.

According to another embodiment, the ohmic reflective layer 430 may include a transparent oxide layer forming ohmic contact with the second conductivity type semiconductor layer 423, an insulation layer covering the transparent oxide layer and having an opening exposing the transparent oxide layer, and a metal reflective layer covering the insulation layer and connected to the transparent oxide layer through the opening of the insulation layer. With this structure, the ohmic reflective layer can provide an omnidirectional reflector.

The first insulation layer 440 covers the mesa M and the ohmic reflective layer 430. In addition, the first insulation layer 440 may cover the side surface of the mesa M. Here, the first insulation layer 440 may cover a portion of the first conductivity type semiconductor layer 421 exposed through the side surface of the mesa M. With this structure, the first insulation layer 440 exposes the first conductivity type semiconductor layer 421 disposed along the periphery of the mesa M.

Further, the first insulation layer 440 is formed with at least one opening 441 that exposes the ohmic reflective layer 430. The opening 441 of the first insulation layer 440 is disposed on the lower surface of the mesa M on which the second pad metal layer 452 will be formed later. The second pad metal layer 452 is electrically connected to the second conductivity type semiconductor layer 423 through the opening 441.

The first insulation layer 440 may be composed of a single layer of $SiO_2$ or $Si_3N_4$. However, it should be understood that the first insulation layer 440 is not limited thereto. For example, the first insulation layer 440 may have a multilayer structure including a silicon nitride layer and a silicon oxide layer, and may include a distributed Bragg reflector in which silicon oxide layers and titanium oxide layers are alternately stacked one above another.

The first pad metal layer 451 is formed on a lower surface of the first insulation layer 440 and a lower surface of a portion of the first conductivity type semiconductor layer 421 exposed through the first insulation layer 440. The first pad metal layer 451 is insulated from the mesa M and the ohmic reflective layer 430 by the first insulation layer 440. With this structure, the first pad metal layer 451 contacts the first conductivity type semiconductor layer 421 and is electrically connected thereto.

The second pad metal layer 452 is formed on the lower surface of the first insulation layer 440 having the opening 441 therein and in the opening 441 to be spaced apart from the first pad metal layer 451. With this structure, the second pad metal layer 452 is electrically connected to the ohmic reflective layer 430 through the opening 441.

In some embodiments, the first pad metal layer 451 and the second pad metal layer 452 may be formed of the same material by the same process. In other embodiments, a different material and/or a different process may be available. Each of the first pad metal layer 451 and the second pad metal layer 452 may include an ohmic reflective layer, such as an Al layer. The ohmic reflective layer may be formed on a lower surface of a bonding layer such as a Ti, Cr or Ni layer. In addition, a protective layer having a single layer structure of Ni, Cr or Au, or a complex layer structure thereof may be formed on a lower surface of the ohmic reflective layer. For example, the first pad metal layer 451 and the second pad metal layer 452 may have a stack structure of Cr/Al/Ni/Ti/Ni/Ti/Au/Ti.

The second insulation layer 460 is formed to cover the first pad metal layer 451 and the second pad metal layer 452. The second insulation layer 460 may cover the first conductivity type semiconductor layer 421 exposed along the periphery of the mesa M. Here, the second insulation layer 460 may expose the first conductivity type semiconductor layer 421 disposed at an edge of the substrate 410.

The second insulation layer 460 includes a first opening 461 exposing the first pad metal layer 451 and a second opening 462 exposing the second pad metal layer 452. The first opening 461 and the second opening 462 may be disposed in regions on the lower surface of the mesa M.

Referring to FIG. 7, the first opening 461 and the second opening 462 of the second insulation layer 460 are spaced apart from each other and are formed in an elongated shape along the long side of the substrate 410. Further, at least one of the first opening 461 and the second opening 462 may be formed to intersect with a central line C. Here, the central line C refers to a line parallel to the short side of the lower surface of the light emitting diode chip 400 or the substrate 410 and passing the center of the lower surface. That is, the central line C is a line extending from the center between opposite short sides of the light emitting diode chip to a long side thereof. Referring to FIG. 7, both the first opening 461 and the second opening 462 are formed to intersect with the central line C.

The second insulation layer 460 may be formed of a single layer of $SiO_2$ or $Si_3N_4$, without being limited thereto. For example, the second insulation layer 460 may have a multilayer structure including a silicon nitride layer and a silicon oxide layer, and may include a distributed Bragg reflector in which silicon oxide layers and titanium oxide layers are alternately stacked one above another.

Referring again to FIG. 7, the first bump pad 470 and the second bump pad 480 are formed on the first pad metal layer 451 and the second pad metal layer 452, respectively, and protrude downwards below the second insulation layer 460.

The first bump pad 470 is formed on a lower surface of the first pad metal layer 451 exposed through the first opening 461 of the second insulation layer 460. With this structure, the first bump pad 470 is electrically connected to the first conductivity type semiconductor layer 421 through the first pad metal layer 451.

The second bump pad 480 is formed on a lower surface of the second pad metal layer 452 exposed through the second opening 462 of the second insulation layer 460. With this structure, the second bump pad 480 is electrically connected to the second conductivity type semiconductor layer 423 through the second pad metal layer 452 and the ohmic reflective layer 430. The second pad metal layer 452 may be omitted. Here, the second bump pad 480 may directly contact the ohmic reflective layer 430.

Referring to FIG. 8, a lower surface of each of the first bump pad 470 and the second bump pad 480 may be formed to a greater width than an upper surface thereof so as to cover a portion of a lower surface of the second insulation layer 460. As such, the lower surface of each of the first bump pad 470 and the second bump pad 480 covers the lower surface of the second insulation layer 460, thereby providing a large bonding area for bonding to external components. Accordingly, it is possible to achieve reliable connection between the light emitting diode chip 400 and the external components.

According to this embodiment, the light emitting diode chip 400 includes the first bump pad 470 and the second bump pad 480 covering the lower surface of the second insulation layer 460, as shown in FIG. 7. However, it should be understood that the structure of the light emitting diode chip 400 is not limited thereto. For example, the first bump pad 470 and the second bump pad 480 may be restrictively placed on the first pad metal layer 451 exposed through the first opening 461 and the second opening 462. The first bump pad 470 and the second bump pad 480 are formed along the first opening 461 and the second opening 462 of the second insulation layer 460. Accordingly, the first bump pad 470 is disposed in an elongated shape along one long side of the light emitting diode chip 400. Further, the second bump pad 480 is disposed in an elongated shape along the other long side of the light emitting diode chip 400. That is, the first bump pad 470 and the second bump pad 480 are spaced apart from each other in the lateral direction to be disposed in an elongated shape along both long sides of the light emitting diode chip 400. Referring to FIG. 7, both the first bump pad 470 and the second bump pad 480 have a length to intersect with the central line C.

The first bump pad 470 and the second bump pad 480 are formed of an electrically conductive material. For example, the first bump pad 470 and the second bump pad 480 may be composed of a single metal layer including Au or TiN, or may be composed of multiple layers including an Au layer and a TiN layer. However, it should be understood that the first bump pad 470 and the second bump pad 480 are not limited thereto and may be formed of any electrically conductive material.

Conventionally, a light emitting diode chip having a rectangular periphery is formed with two bump pads at opposite sides with respect to the central line thereof. With this structure, the light emitting diode chip has a higher metal density at the opposite sides thereof than a central region thereof. Thus, the light emitting diode chip having an elongated shape has a problem of easy bending or breakage around the central line.

However, the light emitting diode chip 400 according to this embodiment includes the first bump pad 470 and the second bump pad 480 formed to intersect with the central line and thus does not suffer from such a problem.

Although both the first bump pad 470 and the second bump pad 480 according to this embodiment are formed to intersect with the central line C, the structures of the first bump pad 470 and the second bump pad 480 may be changed depending upon the structure of the first mount 111 and the second mount 121 of the package substrate 200.

As shown in FIG. 6, the light emitting diode chip 400 may be secured to the package substrate 200 by an electrically conductive bonding agent interposed between the bump pads of the light emitting diode chip 400 and each of the first mount 111 and the second mount 121 of the package substrate 200. For example, the light emitting diode chip 400 may be mounted on the package substrate 200 such that the first bump pad 470 and the second bump pad 480 face the first mount 111 and the second mount 121 of the package substrate 200, respectively, followed by bonding the light emitting diode chip 400 to the package substrate 200. The sealing member 310 covers the light emitting diode chip 400 by filling the cavity 131 of the package substrate 200 therewith. The sealing member 310 seals the cavity 131 to prevent foreign matter including moisture and dust from entering the light emitting diode package 300. The sealing member 310 may be formed of an epoxy resin or a silicone resin. Further, the sealing member 310 may further include phosphors or a diffusing agent capable of converting light emitted from the light emitting diode chip 400, as needed.

Although the light emitting diode package 300 according to this embodiment has an elongated structure, the first lead frame 210 and the second lead frame 220 are formed to intersect with the central line C, thereby improving strength of the center of the light emitting diode package. Accordingly, despite the elongated structure, the light emitting diode package 300 is prevented from being bent or broken, thereby improving reliability of the light emitting diode package 300 or a product on which the light emitting diode package 300 is mounted.

Figure 9:
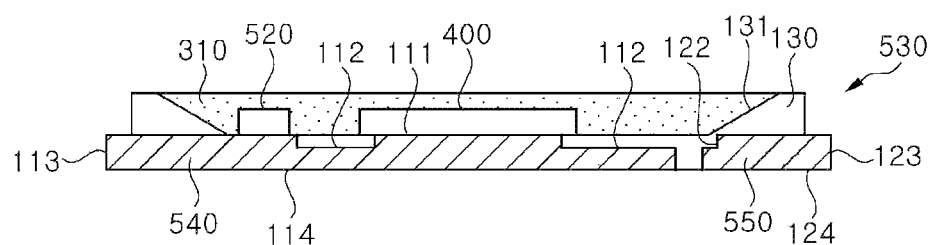
FIG. 9 and FIG. 10 are views of a light emitting diode package according to another embodiment of the present disclosure.
Figure 10:
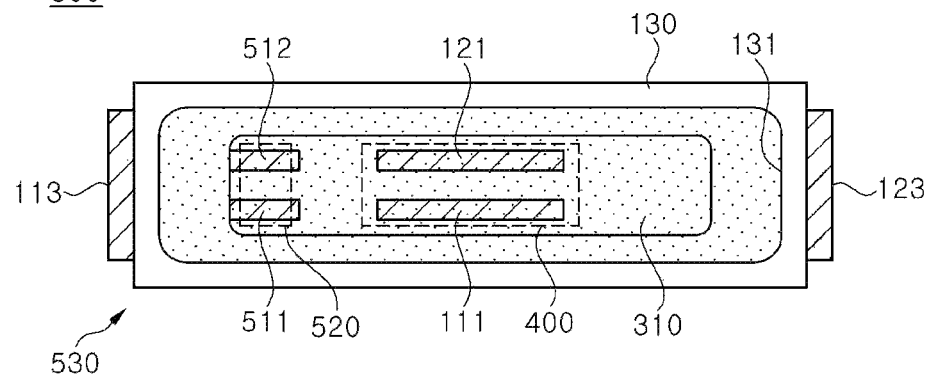

FIG. 9 and FIG. 10 are views of a light emitting diode package according to another embodiment of the present disclosure. FIG. 9 is a sectional view of the light emitting diode package according to this embodiment. FIG. 10 is a top view of the light emitting diode package according to this embodiment.

Referring to FIG. 9 and FIG. 10, the light emitting diode package 500 according to this embodiment includes a package substrate 530, a light emitting diode chip 400, a Zener diode chip 520, and a sealing member 310.

The package substrate 530 is the package substrate 100 according to the first embodiment (see FIG. 1 to FIG. 3), which further includes a first Zener connecting portion 511 and a second Zener connecting portion 512. Alternatively, the package substrate 530 may be the package substrate 200 according to the second embodiment (see FIG. 4 and FIG. 5), which further includes the first Zener connecting portion 511 and the second Zener connecting portion 512.

The first Zener connecting portion 511 is formed on an upper surface of a first lead frame 540. The first Zener connecting portion 511 is disposed between the first groove 112 of the first lead frame 540 and the cavity 131 of the main body 130.

The second Zener connecting portion 512 is formed on an upper surface of a second lead frame 550. The second Zener connecting portion 512 is disposed between one end of the second mount 121 of the second lead frame 550 in a direction of the first terminal 113 and the cavity 131 of the main body 130. Accordingly, the first Zener connecting portion 511 is spaced apart from the second Zener connecting portion 512 in the lateral direction.

The Zener diode chip 520 is mounted on the first Zener connecting portion 511 and the second Zener connecting portion 512 to be electrically connected thereto. The Zener diode chip 520 is connected in parallel to the light emitting diode chip 400.

The light emitting diode package 500 according to this embodiment includes not only the light emitting diode chip 400 but also the Zener diode chip 520 therein such that the light emitting diode chip 400 and the Zener diode chip 520 are electrically connected to each other through the same lead frame. Accordingly, the light emitting diode package 500 according to this embodiment can prevent short circuit due to an external environment as compared with a structure where the light emitting diode chip 400 and the Zener diode chip 520 are individually packaged and connected to each other through a separate circuit board. In addition, the light emitting diode package 500 according to this embodiment allows less consumption in area than the structure where the light emitting diode chip 400 and the Zener diode chip 520 are individually packaged, thereby increasing in intensity of light and enabling further miniaturization of light emitting diode packages.

Figure 11:
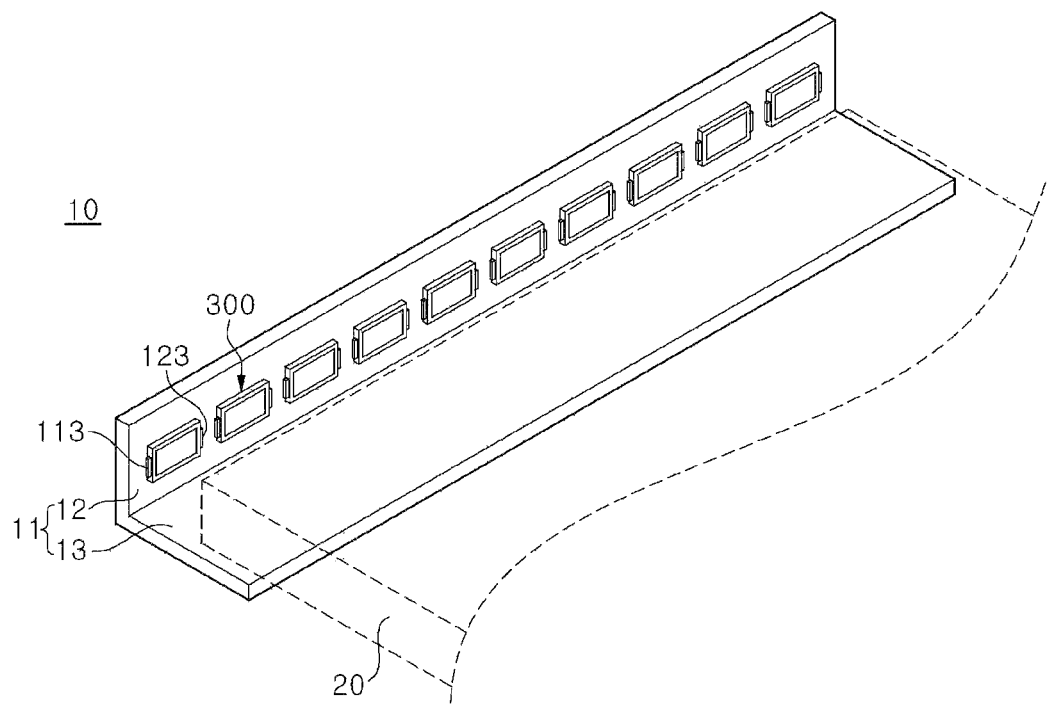
FIG. 11 is a view of a light emitting module according to one embodiment of the present disclosure.

FIG. 11 is a view of a light emitting module according to one embodiment of the present disclosure. Referring to FIG. 11, the light emitting module 10 includes a circuit board 11 and a light emitting diode package 300. The light emitting diode package 300 is the light emitting diode package described with reference to FIG. 6. For details of the light emitting diode package 300, FIG. 6 and the descriptions associated with FIG. 6 are provided above.

The light emitting diode package 300 is mounted on the circuit board 11. In addition, the circuit board 11 is formed with interconnection lines electrically connected to the light emitting diode package 300 mounted thereon. For example, the circuit board 11 may be a printed circuit board, or a flexible printed circuit board including interconnection lines on an insulation layer. Alternatively, the circuit board 11 may be a metal board including interconnection lines on an insulation layer formed on a metal layer. Alternatively, the circuit board 11 may be a ceramic substrate or a synthetic resin board, such as a resin, glass, or epoxy substrate. Alternatively, the circuit board 11 may include at least one selected from the group consisting of an epoxy molding compound (EMC), polyimide (PI), ceramic, graphene, glass synthetic fibers, and combinations thereof.

The circuit board 11 is divided into a first region 12 and a second region 13. The light emitting diode package 300 is disposed in the first region 12. In the first region 12, the light emitting diode package 300 is electrically connected to the interconnection line of the circuit board 11. The first region 12 is disposed to face a side surface of a light guide plate 20 that receives light emitted from the light emitting diode package 300.

The second region 13 is perpendicular to the first region 12. That is, the second region 13 protrudes from the first region 12 towards the light guide plate 20. The circuit board 11 is provided with a plurality of light emitting diode packages 300 in the first region 12. The light emitting diode packages 300 are arranged linearly in the longitudinal direction of the first region 12.

Each of the light emitting diode packages 300 includes a package substrate (not shown) and a light emitting diode chip (not shown) mounted on the package substrate. According to this embodiment, the light emitting diode package 300 has an elongated shape in one direction of the package substrate. The light emitting diode package 300 is provided at opposite side surfaces thereof with terminals such that only one terminal having one polarity is disposed on one side surface thereof. In addition, the light emitting diode package 300 is provided on a lower surface thereof with connecting portions connected to the terminals and having an elongated section. That is, each of the connecting portions of the light emitting diode package 300 has a large area composed of one portion connected to the terminal and another portion extending from the portion. Accordingly, the light emitting diode package 300 is connected to the circuit board 11 through a large area, thereby enabling reliable electrical connection to the circuit board 11.

The light emitting diode package 300 according to this embodiment has the connecting portions exposed to the lower surface thereof and emits light through an upper surface thereof. That is, the lower surface of the light emitting diode package 300 acts as a bonding surface and the upper surface thereof acts as a light emission surface. The circuit board 11 has a structure where the first region 12 is perpendicular to the second region 13. With this structure of the circuit board 11, when the light emitting diode package 300 is bonded to the first region 12 of the circuit board 11, the light emission surface of the light emitting diode package 300 may be disposed to face one side surface of the light guide plate 20 corresponding to a light incidence surface thereof. Thus, light emitted from the light emission surface of the light emitting diode package 300 enters the light guide plate 20 through the light incidence surface of the light guide plate 20, as shown in FIG. 11.

With the light emitting diode package 300 and the circuit board 11 having the structures described above, the light emitting module 10 according to this embodiment does not require bending of the lead frame to be placed on the side surface of the light emitting diode package for implementation of a side view.

In addition, as shown in the drawings, the first terminal 113 and the second terminal 123 are formed to protrude from the opposite side surfaces of the light emitting diode package 300, respectively. The first terminal 113 protrudes from one side surface of the light emitting diode package 300. In addition, the second terminal 123 protrudes from the other side surface of the light emitting diode package 300.

Some fraction of light emitted from the plurality of light emitting diode packages 300 is reflected by the light guide plate 20 towards the circuit board 11. If light reflected by the light guide plate 20 is absorbed by the circuit board 11 through a gap between the light emitting diode packages, dark spots can be generated on the light exit surface of the light guide plate. However, in the light emitting module 10 according to this embodiment, light traveling towards the circuit board 11 is reflected by the first terminal 113 and the second terminal 123 protruding from the opposite side surfaces of the light emitting diode package 300 to enter the light guide plate 20. Accordingly, the light emitting module 10 allows light traveling toward the gap between the light emitting diode packages 300 to be reflected so as not to be absorbed by the circuit board 11, thereby preventing generation of dark spots on the light guide plate due to the gap between the light emitting diode packages 300.

Figure 20:
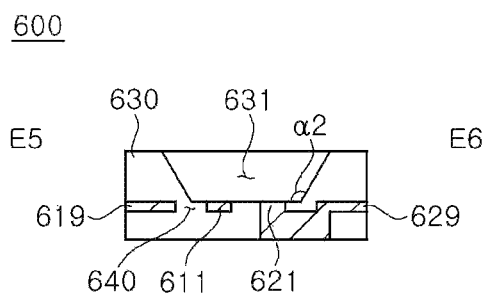
Figure 21:
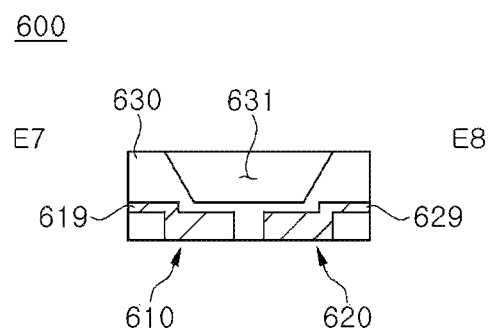
Figure 22:
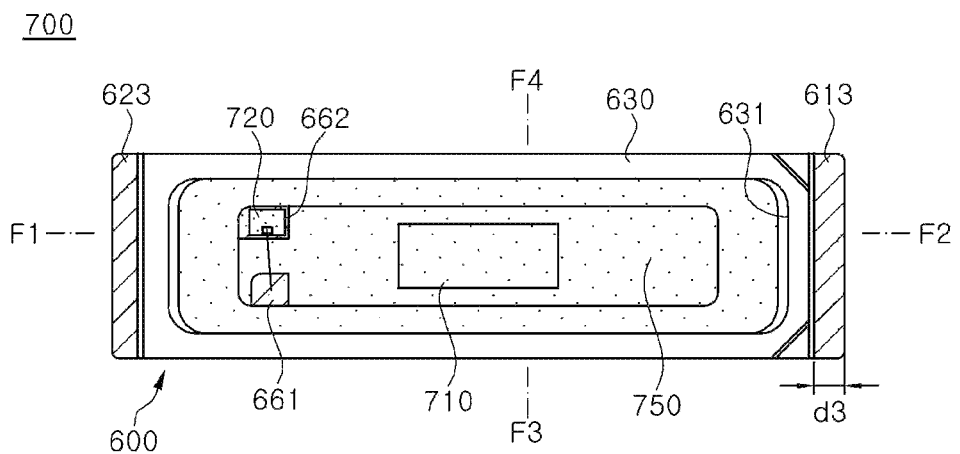
FIG. 22 to FIG. 24 are views of a light emitting diode package according to a further embodiment of the present disclosure.
Figure 23:
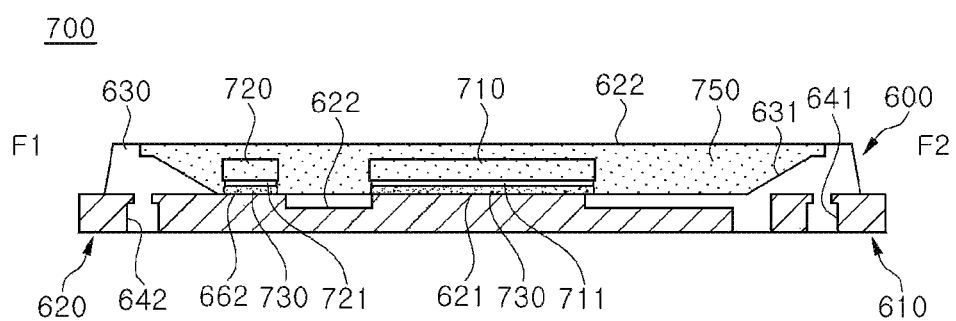
Figure 24:
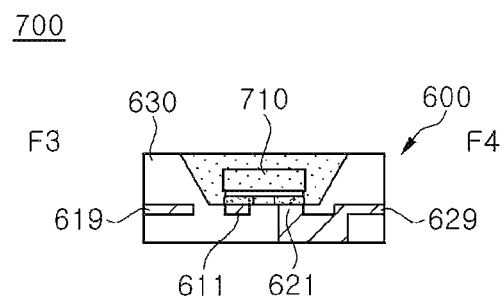

FIG. 12 to FIG. 21 are views of a package substrate according to a third embodiment of the present disclosure. In addition, FIG. 22 to FIG. 24 are views of a light emitting diode package according to a further embodiment of the present disclosure. Here, the light emitting diode package shown in FIG. 22 to FIG. 24 is a light emitting diode package to which the package substrate according to the third embodiment is applied.

Figure 12:
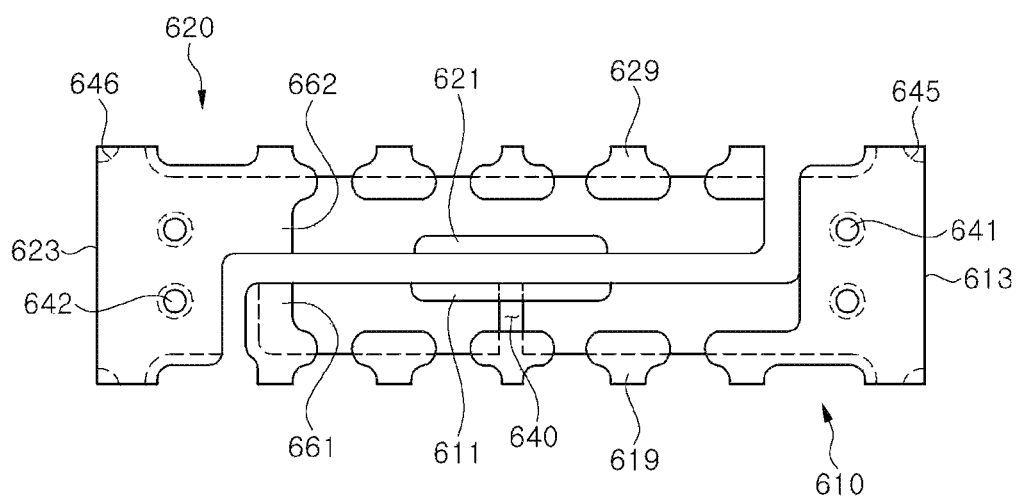
FIG. 12 to FIG. 21 are views of a package substrate according to a third embodiment of the present disclosure.
Figure 13:
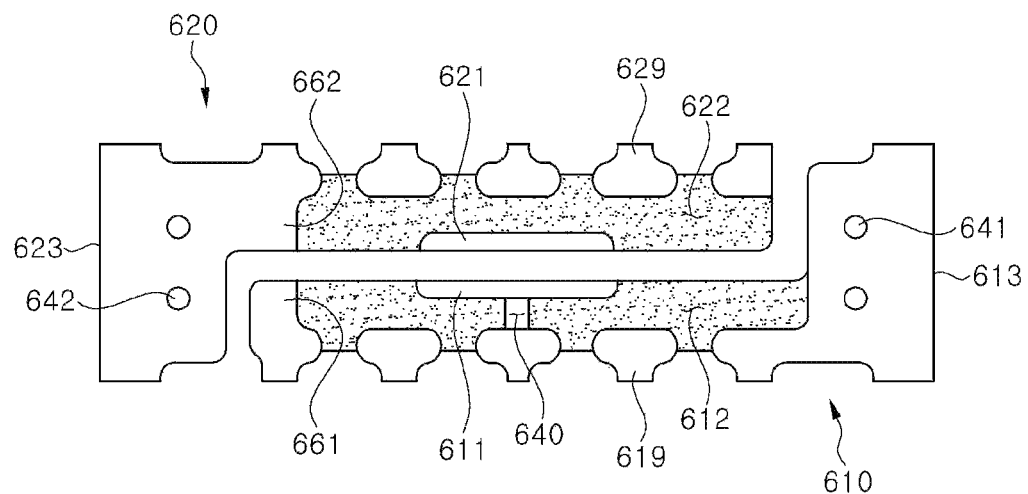
Figure 14:
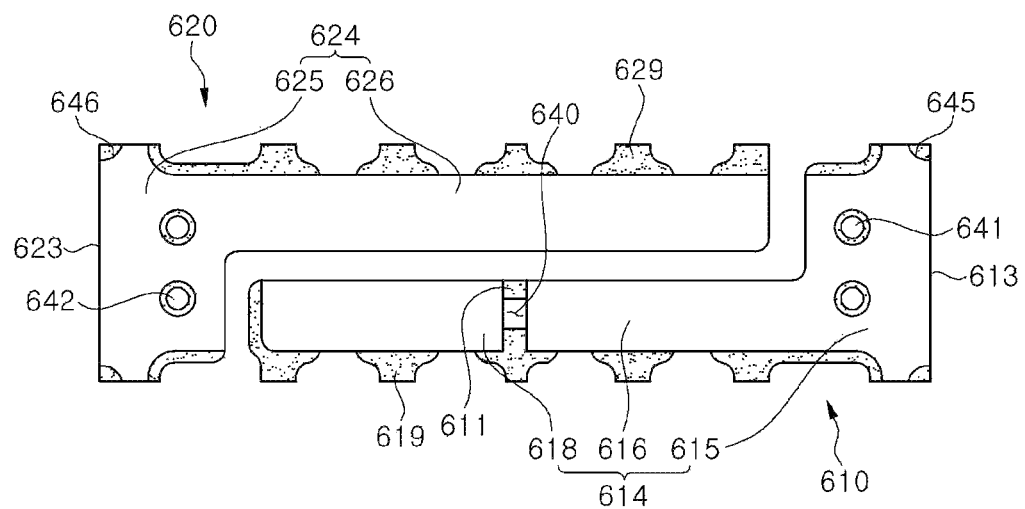
Figure 15:
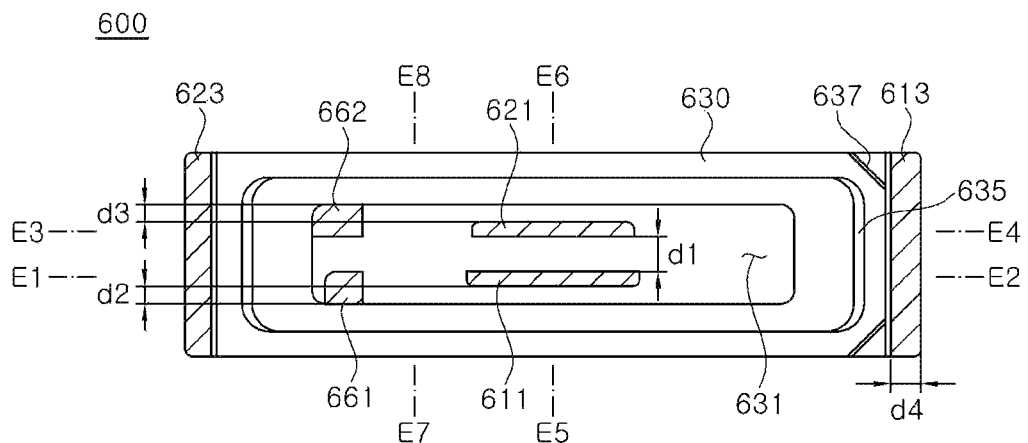
Figure 16:
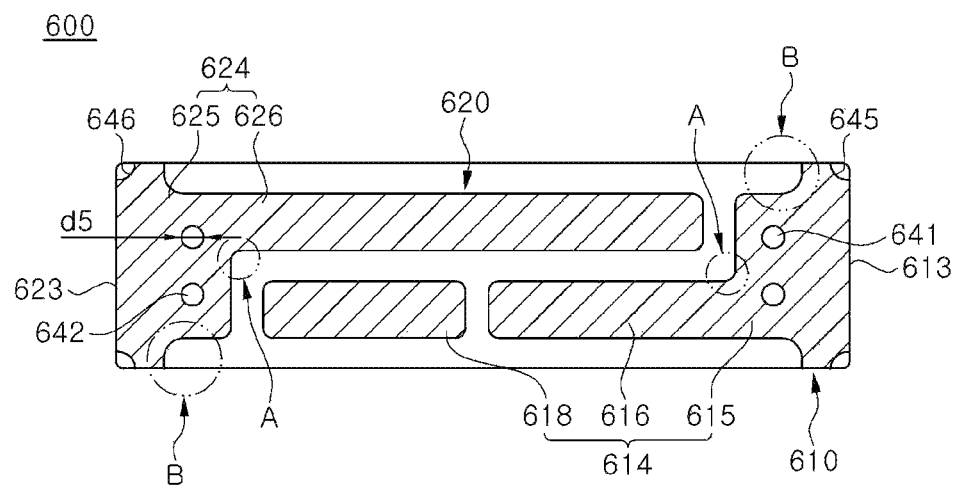
Figure 17:

FIG. 12 to FIG. 14 are views of lead frames of the package substrate according to the third embodiment. FIG. 15 is a plan view of the package substrate according to the third embodiment. FIG. 16 is a bottom view of the package substrate according to the third embodiment. FIG. 17 is a side view of the package substrate according to the second embodiment. In addition, FIG. 18 to FIG. 21 are sectional views of the package substrate according to the third embodiment.

In describing the package substrate 600 according to the third embodiment, the same components as those of the package substrates according to the above embodiments will be briefly described or omitted and the following description will focus on different features thereof.

The package substrate 600 according to the third embodiment includes a first lead frame 610, a second lead frame 620, and a main body 630.

A lower portion of the main body 630 surrounds the first lead frame 610 and the second lead frame 620 and an upper portion of the main body 630 is formed with a cavity 631 (FIG. 15). The first lead frame 610 and the second lead frame 620 are spaced apart from each other in the main body 630 in the lateral direction and are insulated from each other by the main body 630. As shown in FIG. 12 to FIG. 14, the first lead frame 610 includes a first mount 611, a first groove 612, a first Zener connecting portion 661, a first terminal 613, a first connecting portion 614, and first protrusions 619. In addition, the second lead frame 620 includes a second mount 621, a second groove 622, a second Zener connecting portion 662, a second terminal 623, a second connecting portion 624, and a second protrusion 629.

FIG. 12 shows details of upper and lower portions of the first lead frame 610 and the second lead frame 620. In FIG. 12, a solid line indicates external appearances of the upper portions of the first lead frame 610 and the second lead frame 620. That is, the solid line of FIG. 12 corresponds to a plan view of the first lead frame 610 and the second lead frame 620 shown in FIG. 13. In addition, a dotted line of FIG. 12 indicates lower external appearances of the lower portions of the first lead frame 610 and the second lead frame 620 blocked by the upper portions thereof. That is, in FIG. 12, the dotted line and the solid line connected to the dotted line correspond to a rear view of the first lead frame 610 and the second lead frame 620 shown in FIG. 14.

Referring to FIG. 13, shadow-patterned portions of the first lead frame 610 and the second lead frame 620 correspond to half-etched portions of upper surfaces thereof. The half-etched portion of the upper surface of the first lead frame 610 corresponds to the first groove 612. As shown in FIG. 13, the first groove 612 is formed around the first mount 611. In addition, the half-etched portion of the upper surface of the second lead frame 620 corresponds to the second groove 622. As shown in FIG. 14, the second groove 622 is formed around the second mount 621. Referring to FIG. 14, the shadow-patterned portions of the first lead frame 610 and the second lead frame 620 correspond to half-etched portions of lower surfaces thereof.

The lower portion of the first lead frame 610 is subjected to half-etching along outer peripheries of a first element 615, a second element 616 and a fifth element 618 in a minor axis direction thereof excluding a portion facing a fourth element 626 of the second lead frame 620 and the first terminal 613. By half-etching, lower portions of the plural first protrusions 619 are partially exposed.

In the lower portion of the first lead frame 610, a gap between the second element 616 and the fifth element 618 which are spaced apart from each other are partially subjected to half-etching.

Figure 18:
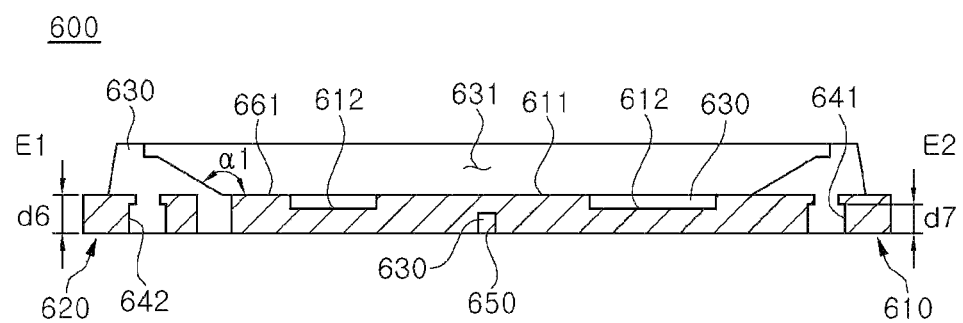

A half-etched portion at one side of the gap between the second element 616 and the fifth element 618 corresponds to a portion of a lower portion of the first mount 611. In a cross-sectional view of this portion, the first lead frame 610 has a structure where the lower portion of the first mount 611 is subjected to half-etching to form a third groove 650, as shown in FIG. 18. The third groove 650 is filled with the main body 630, thereby improving bonding strength between the first lead frame 610 and the main body 630.

A half-etched portion at the other side of the gap between the second element 616 and the fifth element 618 corresponds to a portion of a lower portion of one of the first protrusions 619. Here, one side refers to a side facing the second lead frame 620 and the other side refers to a side opposite to the one side.

Accordingly, although the second element 616 and the fifth element 618 are spaced apart from each other, upper portions thereof are connected to each other by the first mount 611 and one first protrusion 619. With this structure, a separation space 640 in which the second element 616 is spaced apart from the fifth element 618 is formed between the first mount 611 and the first protrusion 619. That is, the first lead frame 610 has a structure wherein a through-hole is formed between the first mount 610 and the first protrusion 619. Referring to FIG. 20, the separation space 640 is filled with the main body 630, thereby improving bonding strength between each of the first lead frame 610 and the second lead frame 620 and the main body 630.

First through-holes 641 as shown in FIG. 29 have a structure where a lower portion thereof is subjected to half-etching to have a larger diameter than an upper portion thereof.

First burr preventing portions 645 are formed by half-etching corners of the lower surface of the first lead frame 610, which are placed in the minor axis direction thereof. The first terminal 613 is disposed between two first burr preventing portions 645.

Half-etched portions of the lower surface of the second lead frame 620 correspond to second protrusions 629, second through-holes 642, and second burr preventing portions 646.

The lower portion of the second lead frame 620 is subjected to half-etching along outer peripheries of a third element 625 and a fourth element 626 in a minor axis direction thereof excluding a portion facing the first lead frame 610 and the second terminal 623. By half-etching, lower portions of the plural second protrusions 629 are partially exposed.

The second through-holes 642 have a structure wherein a lower portion thereof is subjected to half-etching to have a larger diameter than an upper portion thereof.

The second burr preventing portions 646 are formed by half-etching corners of the lower surface of the second lead frame 620, which are placed in the minor axis direction thereof. The second terminal 623 is disposed between two second burr preventing portions 646.

The first burr preventing portions 645 and the second burr preventing portions 646 serve to prevent generation of burrs at corners of a cut surface upon dicing in a process of separating a plurality of package substrates or light emitting diode packages connected to one another.

Each of the first lead frame 610 and the second lead frame 620 may have the same thickness d6 (see FIG. 18) as the width of the light emitting diode chip mounted on the package substrate 600. Here, the thickness of each of the first lead frame 610 and the second lead frame 620 refers to a distance from an upper surface thereof to a lower surface thereof having no etched portions. In addition, the width of the light emitting diode chip refers to a distance between opposite sides of the light emitting diode in a major axis direction thereof. For example, the first lead frame 610 and the second lead frame 620 may have a thickness d6 of 250 μm and the light emitting diode chip mounted on the package substrate 600 may have a width of 250 μm.

For example, the package substrate 600 may have a total thickness of 700 μm and a total width of 7,000 μm. Here, the total thickness of the package substrate 600 refers to a distance from the lower surface of the main body 630, to which the first connecting portion 614 of the first lead frame 610 and the second connecting portion 624 of the second lead frame 620 are exposed, to the upper surface of the main body 630 on which the cavity 631 is formed. Further, the total width of the package substrate 600 refers to a distance from one side surface of the main body 630 on which the first terminal 613 of the first lead frame 610 is exposed to the other side surface of the main body 630, to which the second terminal 623 of the second lead frame 620 is exposed. The total thickness and the total width of the light emitting diode package 700 (see FIG. 22 to FIG. 24), in which the light emitting diode chip is mounted on the package substrate 600 and the cavity 631 is filled with the sealing member, are also the same as those of the package substrate 600.

The first mount 611, the first groove 612 and the first Zener connecting portion 661 (FIG. 15) are formed on the upper surface of the first lead frame 610. In addition, the second mount 621, the second groove 622 and the second Zener connecting portion 662 are formed on the upper surface of the second lead frame 620, as shown in FIG. 15.

Referring to FIG. 15, the first mount 611, the second mount 621, the first Zener connecting portion 661 and the second Zener connecting portion 662 are exposed through the cavity 631 of the package substrate 600.

The first groove 612 is formed along the periphery of the first mount 611 and the second groove 622 is formed along the periphery of the second mount 621. That is, the first groove 612 surrounds the first mount 611 and the second groove 622 surrounds the second mount 621. In other words, the first groove 612 or the second groove 622 is formed on the bottom of the cavity 631 at an exposed lower portion of the main body 630 around the first mount 611 and the second mount 621. With this structure, the first groove 612 divides the first mount 611 from the first Zener connecting portion 661, and the second groove 622 divides the second mount 621 from the second Zener connecting portion 662.

As shown in FIG. 22 to FIG. 24, the light emitting diode chip 710 is mounted on the first mount 611 and the second mount 621 and is electrically connected to the first mount 611 and the second mount 621. In addition, the first Zener connecting portion 661 and the second Zener connecting portion 662 are electrically connected to the Zener diode chip 720. The bump pads 711 of the light emitting diode chip 710 are disposed on the first mount 611 and the second mount 621, respectively.

The sizes of the first mount 611 and the second mount 621 and a distance between the first mount 611 and the second mount 621 correspond to the sizes of the bump pads 711 of the light emitting diode chip 710 and a distance between the bump pads 711. That is, the size of each of the first mount 611 and the second mount 621 and the distance d1 therebetween may be substantially the same as those of the bump pads of the light emitting diode chip 710. In this case, as shown in FIG. 22, when the light emitting diode chip 710 is mounted on the package substrate 600, the light emitting diode chip 710 covers the first mount 611 and the second mount 621 to prevent the first mount 611 and the second mount 621 from being exposed to the outside. However, it should be understood that the sizes of the first mount 611 and the second mount 621 are not limited to the sizes of the bump pads of the light emitting diode chip 710. Alternatively, the first mount 611 and the second mount 621 may be formed in a larger area than the bump pads of the light emitting diode chip 710 to allow deposition of a large amount of an electrically conductive bonding agent 730 in order to improve bonding strength between the light emitting diode chip 710 and the package substrate 600. In this case, when the light emitting diode chip 710 is mounted on the package substrate 600, the first mount 611 and the second mount 621 can be exposed to the outside.

For example, the distance d1 between the first mount 611 and the second mount 621 may be 250 μm.

A distance d2 between the first mount 611 and one inner wall of the main body 630 and a distance d3 between the second mount 621 and the other inner wall of the main body 630 are set in consideration of the size and luminous efficacy of the light emitting diode package. Here, the inner wall of the main body 630 refers to an inner wall defining the cavity 631 and faces the other inner wall thereof in the minor axis direction of the main body 630.

If d2 and d3 are too large, the size of the light emitting diode package increases. If d2 and d3 are too small, the distance between the light emitting diode chip 710 and the inner wall of the main body 630 excessively decreases. In this case, light emitted through the side surface of the light emitting diode chip 710 is reflected by the inner wall of the main body 630 to enter the light emitting diode chip 710. As a result, luminous efficacy of the light emitting diode package deteriorates. On the package substrate 600 according to this embodiment, the light emitting diode chip 710 having the bump pads 711 biased in one direction is mounted. Accordingly, in order to ensure the reliable connection between the light emitting diode chip 710 and the package substrate 600, the first mount 611 and the second mount 621 are also formed to be biased in one direction. For example, d2 is 130 μm and d3 is 120 μm. However, it should be understood that d2 and d3 are not limited to different values and may be identical to, or different from each other depending upon the locations of the bump pads 711. For example, both d2 and d3 may be 130 μm, or 120 μm.

The first terminal 613 of the first lead frame 610 protrudes from one side surface of the main body 630 in the major axis direction thereof. That is, the first terminal 613 protrudes from one side surface of the main body 630, which has a short length. In addition, the second terminal 623 of the second lead frame 620 protrudes from the other side surface of the main body 630 in the major axis direction thereof. For example, each of the first lead frame 610 and the second lead frame 620 may have a protrusion distance d4 of 200 μm.

An upper width of the first terminal 613 and an upper width of the second terminal 623 are the same as a width of the other side surface of the main body 630. Here, the width refers to a distance between opposite sides thereof in the minor axis direction of the package substrate 600.

The first lead frame 610 is formed with a plurality of first protrusions 619 on one side surface thereof, which is placed in the minor axis direction of the main body 630 and has a long length. Here, the one side surface of the first lead frame 610 having the plurality of protrusions 619 thereon is opposite to the other side surface thereof, which faces the second lead frame 620 and has a long length.

The plural first protrusions 619 are linearly arranged along the one side surface of the first lead frame 610 and are spaced apart from one another. Each of the first protrusions 619 is formed by half-etching a portion of the lower surface of the first lead frame 610 connected to the one side surface of the first lead frame 610, which has a long length. Accordingly, each of the first protrusions 619 protrudes from the upper surface of the first lead frame 610 in the lateral direction, as shown in FIG. 20 and FIG. 21. Further, a lower portion of each of the first protrusions 619 having a concave shape formed by half-etching is filled with the main body 630.

The first protrusions 619 of the first lead frame 610 are exposed to one side surface of the main body 630, which has a long length, as shown in FIG. 17.

The second lead frame 620 is formed with a plurality of second protrusions 629 on one side surface thereof, which is placed in the minor axis direction of the main body 630 and has a long length. Here, the one side surface of the second lead frame 620 having the plurality of second protrusions 629 thereon is opposite to the other side surface thereof, which faces the first lead frame 610 and has a long length.

The plural second protrusions 629 are linearly arranged along the one side surface of the second lead frame 620 and are spaced apart from one another. Each of the second protrusions 629 is formed by half-etching a portion of the lower surface of the second lead frame 620 connected to the one side surface of the second lead frame 620, which has a long length. Accordingly, each of the second protrusions 629 protrudes from the upper surface of the second lead frame 620 in the lateral direction, as shown in FIG. 20 and FIG. 21. Further, a lower portion of each of the second protrusions 629 having a concave shape formed by half-etching is filled with the main body 630.

The second protrusions 629 of the second lead frame 620 are exposed to the other side surface of the main body 630, which has a long length.

According to this embodiment, a bonding area between each of the first lead frame 610 and the second lead frame 620 and the main body 630 is increased by the first protrusions 619 and the second protrusions 629.

The main body 630 has half-etched upper corners on one of the opposite side surfaces thereof in the major axis direction. This structure is an electrode mark 637 indicating an electrode direction of the package substrate 600. The electrode mark 637 may be disposed at an upper portion of the lead frame connected to one of a cathode and an anode of an external power source of the package substrate 600.

Referring to FIG. 16, the first connecting portion 614 of the first lead frame 610 and the second connecting portion 624 of the second lead frame 620 are exposed to the lower surface of the main body 630. The first connecting portion 614 is divided into a first element 615, a second element 616 and a fifth element 618, and the second connecting portion 624 is divided into a third element 625 and a fourth element 626.

The first element 615 extends from the first terminal 613 and is connected to the second element 616. That is, the first element 615 has a large area extending to an external region of the main body 630 instead of being restrictively placed in a region of the main body 630.

The second element 616 extends from a portion of the first element 615 and has a smaller width than the first element 615. The second element 616 has an elongated shape extending towards the other side surface of the main body 630.

The fifth element 618 is spaced apart from the second element 616 and is disposed between the second element 616 and the third element 625. The fifth element 618 is spaced apart from the second element 616. However, in the first lead frame 610, the second element 616 is partially connected to an upper portion of the fifth element 618. That is, a lower portion of the first lead frame 610 corresponding to the second element 616 and the fifth element 618 is partially separated from an upper portion thereof. However, in the first lead frame 610, the second element 616 is partially connected to the upper portion of the fifth element 618 by the first mount 611 and the first protrusion 619. In the first lead frame 610, a space between the second element 616 and the fifth element 618 is filled with the main body 630. With this structure, a bonding area between the first lead frame 610 and the main body 630 increases, thereby improving bonding strength therebetween. Further, this structure allows a material for the main body 630 to flow efficiently through a gap between the first lead frame 610 and the second lead frame 620. As a result, air tightness between the main body 630 and the first lead frame 610 and the second lead frame 620 can improve. Further, air or gas injected into the cavity 631 of the light emitting diode package 700 (see FIG. 22 to FIG. 24) during a packaging process or generated in the cavity thereof after the packaging process can be discharged through the upper portion of the first lead frame 610 having a separation space.

The third element 625 extends from the second terminal 623 to be connected to the fourth element 626. Further, the fourth element 626 extends from a portion of the third element 625 and has a smaller width than the third element 625. The fourth element 626 has an elongated shape extending towards the other side surface of the main body 630.

According to this embodiment, all corners of the first lead frame 610 and the second lead frame 620 are formed to have a radius of curvature. As the corners of the first lead frame 610 and the second lead frame 620 have a radius of curvature, a bonding area between each of the first lead frame 610 and the second lead frame 620 and the main body 630 increases, thereby improving bonding strength therebetween. In a structure where each of the lead frames has angled corners, the corners of the lead frames cannot be completely filled with a resin for the main body, and a space can be generated between the lead frames and the main body 630. However, according to this embodiment, the corners of the first lead frame 610 and the second lead frame 620 have a radius of curvature and thus can be completely filled with the resin for the main body 630. Thus, the package substrate 600 according to this embodiment can have improvement in air tightness between each of the first lead frame 610 and the second lead frame 620 and the main body 630.

In this embodiment, the first lead frame 610 is formed with two first through-holes 641 and the second lead frame 620 is also formed with two second through-holes 642, as shown in FIG. 16. The first through-holes 641 are disposed in the first element 615 and are formed to penetrate the first lead frame 610 from the upper surface of the first lead frame 610 to the lower surface thereof. In addition, the second through-holes 642 are disposed in the third element 625 and are formed to penetrate the second lead frame 620 from the upper surface of the second lead frame 620 to the lower surface thereof.

The two first through-holes 641 and the two second through-holes 642 are filled with the main body 630, thereby improving bonding strength between each of the first lead frame 610 and the second lead frame 620 and the main body 630.

According to this embodiment, the first through-holes 641 and the second through-holes 642 are formed to have sizes that can be formed by injection molding of the first lead frame 610 and the second lead frame 620. In addition, the two first through-holes 641 and the two second through-holes 642 may be formed as large as possible in the first element 615 and the third element 625. As the size of each of the first through-holes 641 and the second through-holes 642 increases, air tightness between the first and second lead frames and the main body 630 can be further improved. That is, each of the first through-holes 641 and the second through-holes 642 may be formed to a size in consideration of the injection molding process of the first lead frame 610 and the second lead frame 620, bonding strength and air tightness between each of the first lead frame 610 and the second lead frame 620 and the main body 630. For example, the first through-holes 641 and the second through-holes 642 may have a diameter d5 of 300 μm.

In addition, referring to FIG. 16, a first curved corner A of each of the first lead frame 610 and the second lead frame 620 has a different radius of curvature than a second curved corner B thereof. The first curved corner A of the first lead frame 610 is a portion at which the first element 615 is connected to the second element 616, and faces a corner of the fourth element 626 of the second lead frame 620. In addition, the first curved corner A of the second lead frame 620 is a portion at which the third element 625 is connected to the fourth element 626, and faces a corner of the fifth element 618 of the first lead frame 610.

The first connecting portion 614 of the first lead frame 610 and the second connecting portion 624 of the second lead frame 620 contact an electrically conductive bonding agent. Here, since the first curved corner A corresponds to a portion of each of the first connecting portion 614 and the second connecting portion 624, the width of which abruptly decreases, the electrically conductive bonding agent is more likely to spreading from the interior of each of the first connecting portion 614 and the second connecting portion 624 towards the main body 630 through the first curved corner A than other regions of the first and second lead frames. When the electrically conductive bonding agent contacting the first connecting portion 614 spreads to contact the second connecting portion 624 or the electrically conductive bonding agent contacting the second connecting portion 624 spreads to contact the first connecting portion 614, short circuit can occur between the first lead frame 610 and the second lead frame 620. To prevent this problem, it is desirable that the first curved corner A of the first lead frame 610 be spaced apart as far as possible from the corner of the fourth element 626 of the second lead frame 620 facing the first curved corner A. In addition, it is desirable that the first curved corner A of the second lead frame 620 be spaced apart as far as possible from the corner of the fifth element 618 of the first lead frame 610 facing the first curved corner A. Accordingly, the first curved corner A of each of the first lead frame 610 and the second lead frame 620 has a small radius of curvature in order to be spaced apart as far as possible from the corner of the other lead frame facing the first curved corner A.

The second curved corner B of the first lead frame 610 is a portion of the first element 615 subjected to rounding treatment such that the width of the first element 615 is decreased from the same width as the first terminal 613. In addition, the second curved corner B of the second lead frame 620 is a portion of the third element 625 subjected to rounding treatment such that the width of the third element 625 is decreased from the same width as the second terminal 623. The second curved corner B of each of the first lead frame 610 and the second lead frame 620 is placed near the side surface of the main body 630 in the minor axis direction thereof.

The opposite side surfaces of the main body 630 in the minor axis direction thereof have a smaller bonding area with respect to the first lead frame 610 and the second lead frame 620 than the central portion of the main body 630. Accordingly, the second curved corners B of the first lead frame 610 and the second lead frame 620 placed near the opposite side surfaces of the main body 630 are formed to have a large radius of curvature in order to increase the bonding area with respect to the main body 630. Further, since the second curved corners B of the first lead frame 610 and the second lead frame 620 have a large radius of curvature, the main body 630 can be brought into close contact with the second curved corners B. Accordingly, bonding strength and adhesion between each of the first lead frame 610 and the second lead frame 620 and the main body 630 may improve by the second curved corners B of the first lead frame 610 and the second lead frame 620 having a large radius of curvature. The light emitting diode package including the package substrate 600 has good air tightness, thereby preventing foreign matter including gas, moisture, and dust from entering the light emitting diode package.

As such, according to this embodiment, the first lead frame 610 and the second lead frame 620 are formed such that the second curved corners B have a larger radius of curvature than the first curved corners A, in consideration of prevention of short circuit due to the electrically conductive bonding agent and improvement in bonding strength and adhesion to the main body 630.

Figure 19:
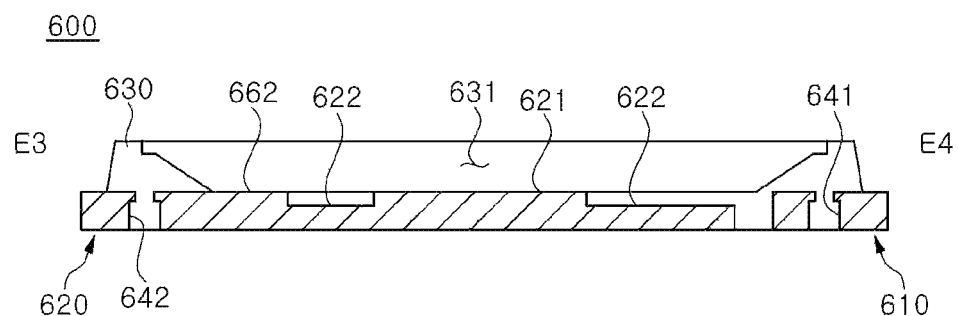

Further, FIG. 18 is a cross-sectional view (E1-E2) taken in the major axis direction of the package substrate 600 according to the third embodiment. FIG. 19 is a cross-sectional view (E3-E4) taken in the major axis direction of the package substrate 600 according to the third embodiment. In addition, FIG. 20 is a cross-sectional view (E5-E6) taken in the minor axis direction of the package substrate 600 according to the third embodiment. Again FIG. 15 illustrates E1-E2, E3-E4, E5-E6 and E7-E8.

Referring to FIG. 15 and FIG. 18, an inner wall of the main body 630 is formed with a groove 635 at an upper portion thereof. The groove 635 is formed on the main body 630 towards an outer wall of the main body 630. The groove 635 is formed between the upper surface of the main body 630 and the inner wall thereof defining the cavity 631. That is, an upper portion of the package substrate 600 has a multi-step structure wherein a corner connecting the upper surface of the main body 630 to the inner wall thereof is depressed by the groove 635.

Although FIG. 15 shows the groove 635 formed on the inner wall of the main body 630 in the major axis direction thereof, it should be understood that the location of the groove 635 is not limited thereto. For example, the groove 635 may be formed on the entire inner wall of the main body 630.

When the cavity 631 is filled with the sealing member (not shown) or the volume of the sealing member expands due to temperature variation, the sealing member can overflow from the cavity 631 of the main body 630. Then, the sealing member overflowing from the cavity 631 flows into the groove 635. Accordingly, the groove 635 can prevent the sealing member from covering the upper surface of the main body 630.

Comparing FIG. 18 with FIG. 20, an inclination $\alpha 2$ of the inner wall of the main body 630 in the minor axis direction is smaller than an inclination $\alpha 1$ of the inner wall of the main body 630 in the major axis direction ($\alpha 1$). Here, the inclination is defined between the bottom of the cavity 631 and the inner wall of the main body. That is, the inner wall of the main body 630 in the minor axis direction is steeper than the inner wall of the main body 630 in the major axis direction.

Referring to FIG. 22 to FIG. 24, when the light emitting diode chip 710 is mounted on the package substrate 600, a distance between the light emitting diode chip 710 and the inner wall of the main body 630 in the minor axis direction is shorter than a distance between the light emitting diode chip 710 and the inner wall of the main body 630 in the major axis direction. That is, the distance between a side surface the light emitting diode chip 710 and the inner wall of the main body 630 in the minor axis direction is short. Accordingly, the inclination of the inner wall of the main body 630 in the minor axis direction is set in consideration of the fact that the main body 630 has a limited width in the minor axis direction and is formed by injection molding. Further, it is desirable that light emitted through the side surface of the light emitting diode chip 710 be reflected in an upward direction of the package substrate 600. Accordingly, the inner wall of the main body 630 in the minor axis direction may be formed to prevent the light emitted through the side surface of the light emitting diode chip 710 from reentering the light emitting diode chip 710 after being reflected by the inner wall of the main body 630. As such, it is desirable that the inclination $\alpha 2$ of the inner wall of the main body 630 in the minor axis direction be set in consideration of the distance to the light emitting diode chip 710, the injection molding process, reentrance of light, and the like.

A shown in FIG. 23, the distance between the light emitting diode chip 710 and the inner wall of the main body 630 in the major axis direction is greater than that in the minor axis direction. That is, a sufficient space is formed between the light emitting diode chip 710 and the inner wall of the main body 630 in the major axis direction. Accordingly, it is desirable that the inclination $\alpha 1$ of the inner wall of the main body 630 in the major axis direction be set to allow light emitted from the light emitting diode chip 710 to travel in the upward direction of the package substrate 600 instead of reentering the light emitting diode chip 710.

For example, the inclination $\alpha 1$ of the inner wall of the main body 630 in the major axis direction is 147° and the inclination $\alpha 2$ of the inner wall of the main body 630 in the minor axis direction is 122°.

With this structure, the light emitting diode package 700 can prevent light emitted from the light emitting diode chip 710 from reentering the light emitting diode chip 710 after being reflected by the inner wall of the main body 630, thereby minimizing light loss of the light emitting diode package.

FIG. 22 to FIG. 24 are views of a light emitting diode package according to a further embodiment of the present disclosure.

FIG. 22 is a top view of the light emitting diode package according to a further embodiment. FIG. 23 is a cross-sectional view (F1-F2) of the light emitting diode package shown in FIG. 22. FIG. 24 is a cross-sectional view (F3-F4) of the light emitting diode package shown in FIG. 22.

The light emitting diode package 700 includes a package substrate 600, a light emitting diode chip 710, a Zener diode chip 720, and a sealing member 750. The package substrate 600 is the package substrate according to the third embodiment described with reference to FIG. 12 to FIG. 21.

Bump pads 711 are disposed on a lower surface of the light emitting diode chip 710. The bump pads 711 of the light emitting diode chip 710 include a bump pad electrically connected to an n-type semiconductor layer of the light emitting diode chip 710 and a bump pad electrically connected to a p-type semiconductor layer thereof.

The light emitting diode chip 710 is disposed on the first mount 611 and the second mount 621. Here, an electrically conductive bonding agent 730 is interposed between the bump pads 711 and each of the first mount 611 and the second mount 621. The light emitting diode chip 710 is secured to the first mount 611 and the second mount 621 and is electrically connected thereto by the electrically conductive bonding agent, as shown in FIG. 24. For example, the electrically conductive bonding agent 730 (FIG. 23) is a solder.

The Zener diode chip 720 is disposed on the second Zener connecting portion 662 and is connected to the second Zener connecting portion 662 by a wire, as shown in FIG. 23. Here, the Zener diode chip 720 is provided on upper and lower surfaces thereof with bump pads 721 electrically connected to the Zener diode chip 720.

An electrically conductive bonding agent 730 may be disposed between the bump pads 721 of the Zener diode chip 720 and the second Zener connecting portion 662. Accordingly, the Zener diode chip 720 is secured to an upper portion of the second Zener connecting portion 662 and is electrically connected to the second Zener connecting portion 662 by the electrically conductive bonding agent 730.

The first mount 611 and the first Zener connecting portion 661 are formed on the first lead frame 610 and are electrically connected to each other. Further, the second mount 621 and the second Zener connecting portion 662 are formed on the second lead frame 620 and electrically connected to each other.

As such, in the light emitting diode package 700 according to this embodiment, the light emitting diode chip 710 is electrically connected in parallel to the Zener diode chip 720.

The cavity 631 of the package substrate 600, which has the light emitting diode chip 710 and the Zener diode chip 720 therein, is filled with the sealing member 750.

Although some embodiments have been described herein with reference to the accompanying drawings, it should be understood that these embodiments are provided for illustration only and are not to be construed in any way as limiting the present disclosure. Therefore, it should be understood that the scope of the present disclosure should be defined by the appended claims and equivalents thereto.

I claim:

1. A light emitting diode package, comprising:
    a main body comprising a cavity at an upper portion thereof and having an elongated shape in one direction thereof, the main body further comprising two short side surfaces facing each other and two long side surfaces facing each other;
    a first lead frame coupled to a bottom of the main body, the first lead frame comprising a first mount exposed to the cavity, a first terminal exposed to one of the two short side surfaces of the main body, and a first connecting portion exposed to a lower surface of the main body; and
    a second lead frame spaced apart from the first lead frame in a lateral direction and coupled to the bottom of the main body, the second lead frame comprising a second mount exposed to the cavity, a second terminal exposed to the other of the two short side surfaces of the main body, and a second connecting portion exposed to the lower surface of the main body,
    wherein the first connecting portion comprises a first element extending from the first terminal and a second element extending from a portion of the first element towards the second terminal and having a smaller width than the first element, and
    the second connecting portion comprises a third element extending from the second terminal and a fourth element extending from a portion of the third element towards the first terminal and having a smaller width than the third element;
    wherein each of the first lead frame and the second lead frame further comprises a groove formed on an upper surface thereof, the groove being formed along a periphery of each of the first mount and the second mount, and the main body covers the groove.

2. The light emitting diode package according to claim 1, wherein
    the second element is disposed between the first element and the third element, and
    the fourth element is disposed between the third element and the first element.

3. The light emitting diode package according to claim 1, wherein the fourth element is disposed between the second element and the third element.

4. The light emitting diode package according to claim 1, wherein the cavity of the main body is configured to tapered toward a lower portion of the main body.

5. The light emitting diode package according to claim 4, wherein the cavity is surrounded by a first pair of inner walls of the main body facing each other and a second pair of inner walls of the main body facing each other, the first pair of inner walls configured to be longer in length than the second pair of inner walls, such that the main body has an elongated shape in the one direction, and
    an inclination of the first pair of inner walls is smaller than an inclination of the second pair of inner walls with reference to a bottom surface of the cavity.

6. The light emitting diode package according to claim 1, wherein the groove is formed on a bottom surface of the cavity included in the main body.

7. The light emitting diode package according to claim 1, wherein each of the first lead frame and the second lead frame further comprises a through-hole formed from an upper surface thereof to a lower surface thereof and filled with a material forming the main body.

8. The light emitting diode package according to claim 7, wherein an upper portion of the through-hole has a smaller width than a lower portion thereof.

9. The light emitting diode package according to claim 1, wherein a first separation distance between the second element and the third element and a second separation distance between the fourth element and the first element are:
    greater than a third separation distance between the second element and the fourth element and
    smaller than a fourth separation distance between the second element and a side surface of the main body and a fifth separation distance between the fourth element and the side surface of the main body.

10. The light emitting diode package according to claim 1, further comprising:
    a light emitting diode chip disposed in the cavity of the main body and electrically connected to the first mount and the second mount; and
    a sealing member filling the cavity to enclose the light emitting diode chip.

11. The light emitting diode package according to claim 10, wherein the light emitting diode chip comprises:
    a substrate having an elongated shape in one direction thereof;
    a light emitting structure comprising a first conductivity type semiconductor layer, an active layer, and a second conductivity type semiconductor layer sequentially stacked on a lower surface of the substrate;
    a first bump pad electrically connected to the first conductivity type semiconductor layer; and
    a second bump pad spaced apart from the first bump pad in a lateral direction and electrically connected to the second conductivity type semiconductor layer;
    wherein the first bump pad and the second bump pad have an elongated shape in the one direction of the substrate; and
    the first bump pad is disposed on the first mount and the second bump pad is disposed on the second mount.

12. The light emitting diode package according to claim 11, wherein a sixth separation distance between the first bump pad and the second bump pad is the same as a seventh separation distance between the first mount and the second mount.

13. The light emitting diode package according to claim 11, wherein a distance from an upper surface of each of the first lead frame and the second lead frame to a lower surface thereof corresponds to a distance between opposite long side surfaces of the light emitting diode chip.

14. The light emitting diode package according to claim 10, further comprising:
a Zener diode chip disposed in the cavity,
wherein each of the first lead frame and the second lead frame further comprises a Zener connecting portion exposed to the cavity and electrically connected to the Zener diode chip, and the Zener diode chip is connected in parallel to the light emitting diode chip by the first lead frame and the second lead frame.

15. The light emitting diode package according to claim 1, wherein a maximum width of each of the first connecting portion and the second connecting portion corresponds to a maximum width of the main body.

16. The light emitting diode package according to claim 1, wherein a corner of a lower surface of the first lead frame connected to the first terminal has a curved corner formed by half-etching and a corner of a lower surface of the second lead frame connected to the second terminal has a curved corner formed by half-etching.

17. The light emitting diode package according to claim 1, wherein at least one of the first lead frame and the second lead frame further comprises at least one protrusion protruding from a side surface thereof,
the at least one protrusion being exposed on a long side surface of the main body.

18. The light emitting diode package according to claim 17, wherein the groove is disposed between the first mount, or the second mount and the protrusion.

19. The light emitting diode package according to claim 17, wherein the protrusion is provided in plural and the groove is disposed between plural protrusions, the plural protrusions being spaced apart from each other by the groove.

20. The light emitting diode package according to claim 17, wherein the first lead frame further comprises a separation space penetrating the first lead frame, the separation space being formed between the at least one protrusion of the first lead frame and the first mount.

21. The light emitting diode package according to claim 1, wherein each of the first lead frame and the second lead frame comprises:
a first curved corner connecting the first element or the third element to the second element or the fourth element and facing the fourth element or the second element; and
a second curved corner connecting a region connected to the first terminal or the second terminal to have a large width to a region connected to the second element or the fourth element to have a relatively small width,
the second curved corner having a larger radius of curvature than the first curved corner.

22. A light emitting module comprising:
a circuit board;
a light guide plate; and
at least one light emitting diode package according to claim 1 mounted on the circuit board,
wherein the at least one light emitting diode package emits light towards one side surface of the light guide plate.

23. The light emitting module according to claim 22, wherein the circuit board further comprises:
a first region in which the light emitting diode package is disposed and comprising a circuit pattern formed on an upper surface thereof; and
a second region perpendicular to the first region.

24. The light emitting module according to claim 23, wherein the first connecting portion and the second connecting portion disposed on a lower surface of the light emitting diode package are connected to the circuit pattern in the first region of the circuit board, and an upper surface of the light emitting diode package through which light is emitted faces the one side surface of the light guide plate.

* * * * *